(12) United States Patent
Eom et al.

(10) Patent No.: US 11,742,465 B2
(45) Date of Patent: Aug. 29, 2023

(54) LIGHTING MODULE AND LIGHTING APPARATUS HAVING SAME

(71) Applicant: LG INNOTEK CO., LTD., Seoul (KR)

(72) Inventors: Dong Il Eom, Seoul (KR); Jae Hyuk Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/056,467

(22) PCT Filed: May 3, 2019

(86) PCT No.: PCT/KR2019/005342
§ 371 (c)(1),
(2) Date: Nov. 18, 2020

(87) PCT Pub. No.: WO2019/225877
PCT Pub. Date: Nov. 28, 2019

(65) Prior Publication Data
US 2021/0367116 A1    Nov. 25, 2021

(30) Foreign Application Priority Data

May 24, 2018    (KR) .......................... 10-2018-0058813

(51) Int. Cl.
*H01L 33/60*    (2010.01)
*F21K 9/64*    (2016.01)
(Continued)

(52) U.S. Cl.
CPC ............... *H01L 33/60* (2013.01); *F21K 9/64* (2016.08); *H01L 33/56* (2013.01); *F21Y 2115/10* (2016.08)

(58) Field of Classification Search
CPC ............ H01L 33/60; H01L 33/56; F21K 9/64
See application file for complete search history.

(56) References Cited

U.S. PATENT DOCUMENTS

| | | | |
|---|---|---|---|
| 5,725,407 A | * | 3/1998 | Liu ........................ H01J 29/327 427/68 |
| 7,781,794 B2 | | 8/2010 | Suehiro et al. |
| 8,870,411 B2 | | 10/2014 | Kon |

(Continued)

FOREIGN PATENT DOCUMENTS

| | | |
|---|---|---|
| DE | 31 48 843 | 6/1983 |
| GB | 2 139 340 | 11/1984 |

(Continued)

OTHER PUBLICATIONS

International Search Report dated Aug. 21, 2019 issued in Application No. PCT/KR2019/005342.

(Continued)

*Primary Examiner* — Evan P Dzierzynski
*Assistant Examiner* — Nathaniel J Lee
(74) *Attorney, Agent, or Firm* — KED & Associates LLP

(57) ABSTRACT

A lighting module disclosed in an embodiment of the invention includes a substrate; a plurality of light emitting devices disposed on the substrate; a resin layer disposed on the plurality of light emitting devices; and a reflective member disposed around the plurality of light emitting devices. The reflective member includes a plurality of reflective units including a first reflective region and a second reflective region facing the first reflective region. At least one of the plurality of reflective units has a first angle between a straight line connecting an uppermost point of the first reflective region and a first point where the substrate and the first reflective region are in contact with each other and a tangent line of the substrate at the first point, and has a second angle between a straight line connecting an uppermost point of the second reflective region and a second point where the substrate and the second reflective region are in contact with each other and a tangent line of the substrate at the second point, and wherein at least one of the plurality of (Continued)

reflective units has the first angle and the second angle different from each other.

20 Claims, 9 Drawing Sheets

(51) Int. Cl.
*H01L 33/56* (2010.01)
*F21Y 115/10* (2016.01)

(56) References Cited

U.S. PATENT DOCUMENTS

| | | |
|---|---|---|
| 9,741,700 B2 | 8/2017 | Kim |
| 2006/0002146 A1 | 1/2006 | Baba |
| 2008/0048200 A1 | 2/2008 | Mueller et al. |
| 2009/0045416 A1 | 2/2009 | Bierhuizen et al. |
| 2009/0090928 A1* | 4/2009 | Mori ............... H05K 3/44 438/42 |
| 2009/0242928 A1 | 10/2009 | Suehiro et al. |
| 2009/0295265 A1* | 12/2009 | Tabuchi ............. H01L 33/56 313/112 |
| 2011/0193105 A1 | 8/2011 | Lerman et al. |
| 2013/0201684 A1 | 8/2013 | Kon |
| 2013/0244355 A1* | 9/2013 | Chen ............. H01L 33/486 257/E33.056 |
| 2014/0204580 A1 | 7/2014 | Yeo et al. |
| 2014/0286019 A1* | 9/2014 | Araki ............... F21V 14/08 349/193 |
| 2017/0254518 A1 | 9/2017 | Vasylyev |
| 2018/0238518 A1* | 8/2018 | Huang ............... F21V 7/041 |
| 2019/0086057 A1 | 3/2019 | Kim |
| 2019/0165223 A1* | 5/2019 | Kiridoshi ............. H01L 33/62 |

FOREIGN PATENT DOCUMENTS

| | | |
|---|---|---|
| JP | 2005-285874 A | 10/2005 |
| JP | 2006-019141 | 1/2006 |
| JP | 2009-231750 A | 10/2009 |
| JP | 5300702 | 9/2013 |
| JP | 2013-247038 A | 12/2013 |
| KR | 10-2009-0127296 | 12/2009 |
| KR | 10-2010-0061686 | 6/2010 |
| KR | 10-2012-0113178 | 10/2012 |
| KR | 10-2012-0118693 | 10/2012 |
| KR | 10-2014-0007510 | 1/2014 |
| KR | 10-2014-0031832 | 3/2014 |
| KR | 10-2014-0092650 | 7/2014 |
| KR | 10-1415582 | 7/2014 |
| KR | 10-2016-0114209 | 10/2016 |
| KR | 10-2016-0144784 | 12/2016 |
| KR | 10-2018-0028683 | 3/2018 |
| WO | WO 2008-117865 A1 | 10/2008 |
| WO | WO 2018/036618 | 3/2018 |

OTHER PUBLICATIONS

European Search Report dated Feb. 17, 2022 issued in EP Application No. 19808450.1.
Korean Office Action dated Nov. 14, 2022 issued in Application 10-2018-0058813.
Chinese Office Action dated Dec. 1, 2022 issued in Application 201980034908.5.
Japanese Office Action dated Apr. 11, 2023 issued in Application 2020-564617.

* cited by examiner

LIGHTING MODULE AND LIGHTING APPARATUS HAVING SAME

CROSS-REFERENCE TO RELATED PATENT APPLICATIONS

This application is a U.S. National Stage Application under 35 U.S.C. § 371 of PCT Application No. PCT/KR2019/005342, filed May 3, 2019, which claims priority to Korean Patent Application No. 10-2018-0058813, filed May 24, 2018, whose entire disclosures are hereby incorporated by reference.

TECHNICAL FIELD

An embodiment of the invention relates to a lighting module having a light emitting device. An embodiment of the invention relates to a light emitting device and a lighting module having a reflective member around the light emitting device. An embodiment of the invention relates to a lighting module that provides a surface light source. An embodiment of the invention relates to a light unit or a vehicle lamp having a lighting module.

BACKGROUND ART

Typical lighting applications include vehicle lights as well as backlights for displays and signs. Light emitting devices, for example, light emitting diodes (LEDs) have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since the emission angle of light emitted from the light emitting diode is small, when the light emitting diode is used as a vehicle lamp, there is a demand for increasing the light emitting area of the lamp using the light emitting diode. Light emitting diodes can increase the design freedom of lamps because of their small size, and are economical due to their semi-permanent lifetime.

DISCLOSURE

Technical Problem

An embodiment of the invention may provide a lighting module that provides a surface light source. An embodiment of the invention may provide a lighting module that is disposed a plurality of light emitting devices and a reflective member disposed around each of the light emitting devices. An embodiment of the invention may provide a lighting module having different curvatures of surfaces of reflective members facing each other based on the light emitting device. An embodiment of the invention may provide lighting modules having different distances from upper ends of the reflective members facing each other based on the light emitting device. An embodiment of the invention may provide a flexible lighting module having a plurality of light emitting devices, a reflective member, and a resin layer on a substrate. An embodiment of the invention may provide a flexible lighting module having a plurality of light emitting devices, a reflective member, a resin layer, and a phosphor layer on a substrate. An embodiment of the invention provides a lighting module with improved light extraction efficiency and light distribution characteristics. An embodiment of the invention provides a lighting module for irradiating a surface light source and a lighting device having the same. An embodiment of the invention may provide a light unit having a lighting module, a display device, or a vehicle lamp.

Technical Solution

A lighting device according to an embodiment of the invention includes a substrate; a plurality of light emitting devices disposed on the substrate; a resin layer disposed on the plurality of light emitting devices; and a reflective member disposed around the plurality of light emitting devices, wherein the reflective member includes a plurality of reflective units including a first reflective region and a second reflective region facing the first reflective region, wherein at least one of the plurality of reflective units has a first angle between a straight line connecting an uppermost point of the first reflective region and a first point where the substrate and the first reflective region are in contact with each other and a tangent line of the substrate at the first point, has a second angle between a straight line connecting an uppermost point of the second reflective region and a second point wherein the substrate and the second reflective region are in contact with each other and a tangent line of the substrate at the second point, and at least one of the plurality of reflective units may have the first angle and the second angle different from each other.

A lighting module according to an embodiment of the invention includes a substrate; a plurality of light emitting devices disposed on the substrate; a resin layer disposed on the plurality of light emitting devices; and a reflective member disposed around the plurality of light emitting devices, wherein the plurality of light emitting devices include a first light emitting device and a second light emitting device, and the reflective member comprises a first reflective unit disposed around the first light emitting device and a second reflective unit disposed around the second light emitting device, wherein the first reflective unit includes a first reflective region disposed on one side of the first light emitting device and a second reflective region disposed on an other side of the first light emitting device. Wherein the second reflective unit includes a first reflective region disposed on one side of the second light emitting device and a second reflective region disposed on an other side of the second light emitting device, and the first reflective unit has a first inclination angle between a straight line passing through an uppermost point of the first reflective region and a center of an upper surface of the first light emitting device and a first tangent line of the substrate in contact with a normal line passing through the center of the upper surface of the first light emitting device, and the second reflective unit has a second inclination angle between a straight line between a straight line passing through an uppermost point of the second reflective region and a center of an upper surface of the second light emitting device and a second tangent line of the substrate in contact with a normal line passing through the center of the upper surface of the second light emitting device, and the first inclination angle of the first reflective unit and the second inclination angle of the second reflective unit may be different from each other.

According to an embodiment of the invention, at least one of the plurality of reflective units may have the first angle smaller than the second angle. According to an embodiment of the invention, the plurality of reflective units may include adjacent first and second reflective units, and the first angles of each of the first and second reflective units may be different from each other. According to an embodiment of the invention, the first angle and the second angle of at least one other of the plurality of reflective units may be the same. According to an embodiment of the invention, a region where the second reflective region of the first reflective unit and the first reflective region of the second reflective unit contact each other may include the uppermost point. According to an embodiment of the invention, the height of the first reflective region and the height of the second reflective region may have the same height from the upper surface of the substrate.

According to an embodiment of the invention, a first distance from the center of the upper surface of the light emitting device to the uppermost point of the first reflective region may be different from a second distance from the center of the upper surface of the light emitting device to the uppermost point of the second reflective region. According to an embodiment of the invention, the first distance may be greater than the second distance. According to an embodiment of the invention, an interval between the plurality of light emitting devices may be the same. According to an embodiment of the invention, the first point and the second point may be spaced apart from a center of a lower surface of the light emitting device by the same distance. According to an embodiment of the invention, the first reflective region and the second reflective region may include curvature. According to an embodiment of the invention, a light shielding portion may be further disposed on the light emitting device in a region overlapping the upper surface of the substrate in a vertical direction.

According to an embodiment of the invention, a phosphor layer disposed on an upper surface and a side surface of the resin layer may be further included, and the reflective unit may be in contact with a side surface of the phosphor layer. According to an embodiment of the invention, the upper surface of the substrate may have a curvature. According to an embodiment of the invention, the height of the reflective member may have a range of 0.4 to 0.6 times the height of the resin layer.

According to an embodiment of the invention, the first reflective unit has a third inclination angle between a straight line passing through an uppermost point of the second reflective region and a center of an upper surface of the first light emitting device and the first tangent line, and the second reflection unit has a fourth inclination angle between a straight line passing through the uppermost point of the second reflective region and the center of the second light emitting device and the second tangent line, and the third inclination angle of the of the first reflective unit and the fourth inclination angle of the second reflective unit may be different from each other. According to an embodiment of the invention, the first inclination angle of the first reflective unit may be greater than the first inclination angle of the second reflective unit. According to an embodiment of the invention, the third inclination angle of the first reflective unit may be smaller than the fourth inclination angle of the second reflective unit.

Advantageous Effects

According to an embodiment of the invention, the light uniformity of the surface light source in the lighting module may be improved, and the difference in light distribution for each region in the flexible lighting module may be reduced. According to an embodiment of the invention, since the lighting module provides a reflective member having different curvatures or different inclined surfaces around each light emitting device, it is possible to prevent a decrease in luminous intensity according to the tilt position of the light emitting device and it may reduce the hot spot on each light emitting device. According to an embodiment of the invention, a flexible lighting module may be implemented by laminating a resin layer made of a resin material on the light emitting device. Embodiments of the invention may improve light efficiency and light distribution characteristics of a lighting module. The optical reliability of the lighting module and the lighting device having the same according to an embodiment of the invention may be improved. The improve the reliability of a vehicle lighting device having a lighting module according to an embodiment of the invention may be improved. Embodiments of the invention may be applied to a backlight unit having a lighting module, various display devices, a surface light source lighting device, or a vehicle lamp.

BEST MODE

Figure 1:
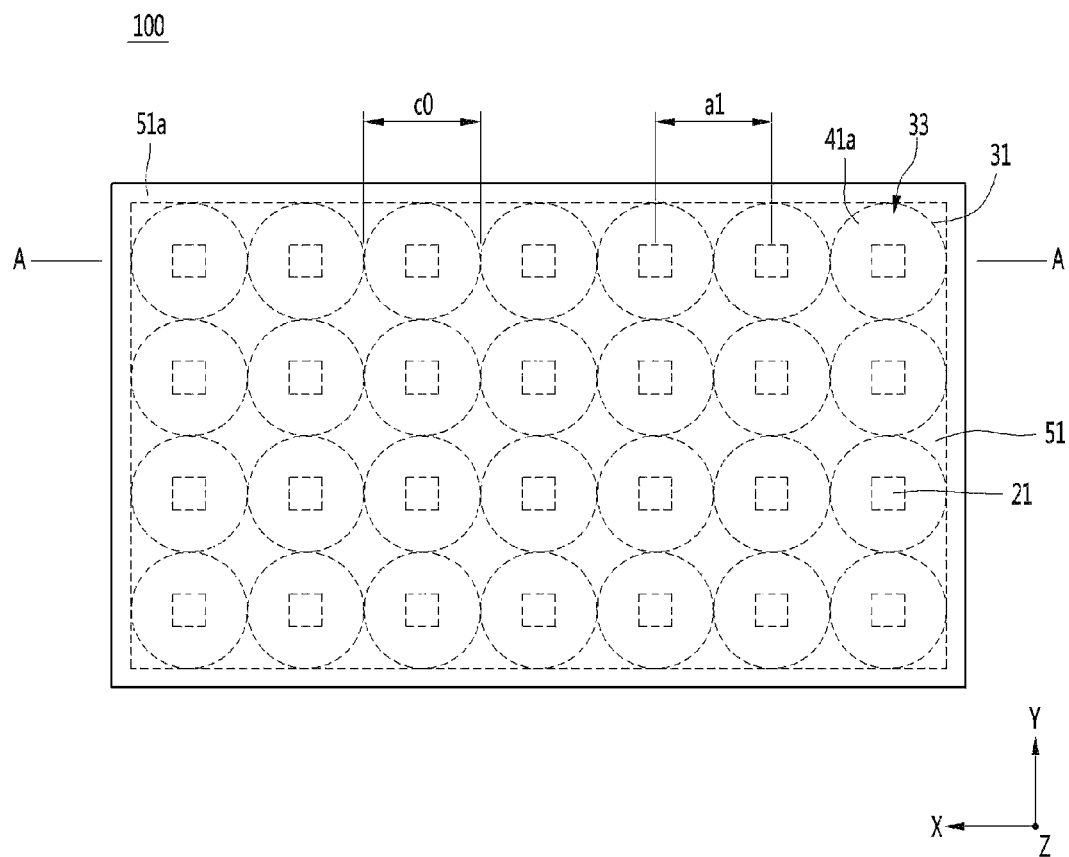
FIG. 1 is a plan view showing a lighting module according to an embodiment of the invention.

Hereinafter, preferred embodiments of the invention will be described in detail with reference to the accompanying drawings, in which a person having ordinary skill in the art to which the invention pertains may easily implement the invention. However, it should be understood that embodiments described in the specification and configurations illustrated in the drawings are merely a preferred embodiment of the invention, and there are various equivalents and modifications that may substitute the embodiments and configurations at the time of filing the present application.

In describing operating principles of a preferred embodiment of the invention in detail, when detailed description of a known function or configuration is deemed to unnecessarily blur the gist of the present disclosure, the detailed description will be omitted. Terms to be described below are defined as terms defined in consideration of functions of the invention and meaning of each term should be interpreted based on the contents throughout the specification. The same reference numerals are used for parts having similar functions and actions throughout the drawings.

A lighting device according to the invention may be applied to various lamp devices requiring lighting, for example, a vehicle lamp, a home lighting device, or an industrial lighting device. For example, when a lighting device is applied to a vehicle lamp, it may be applied to a head lamp, a side mirror lamp, a fog lamp, a tail lamp, a stop lamp, a side marker lamp, a daytime running light, a vehicle interior lighting, a door scarf, rear combination lamps, a backup lamp, and the like. The lighting device of the invention may also be applied to indoor and outdoor advertisement apparatus fields, and also may be applicable to all other lighting-related fields and advertisement-related fields that are currently being developed and commercialized or that may be implemented by technological development in the future.

Hereinafter, embodiments will be shown more apparent through the description of the appended drawings and embodiments. In the description of the embodiments, in the case in which each layer (film), area, pad or pattern is described as being formed "on" or "under" each layer (film), area, pad or pattern, the "on" and "under" include both of forming "directly" and "indirectly". Also, the reference for determining "on" or "under" each layer will be described based on the figures.

Figure 2:
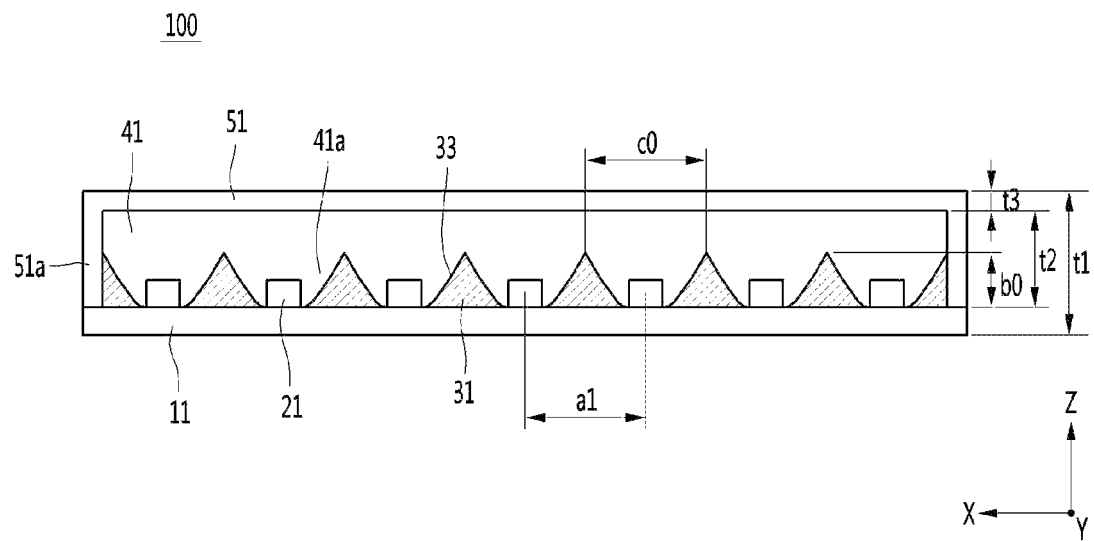
FIG. 2 is a cross-sectional view of A-A side of the lighting module of FIG. 1.
Figure 3:
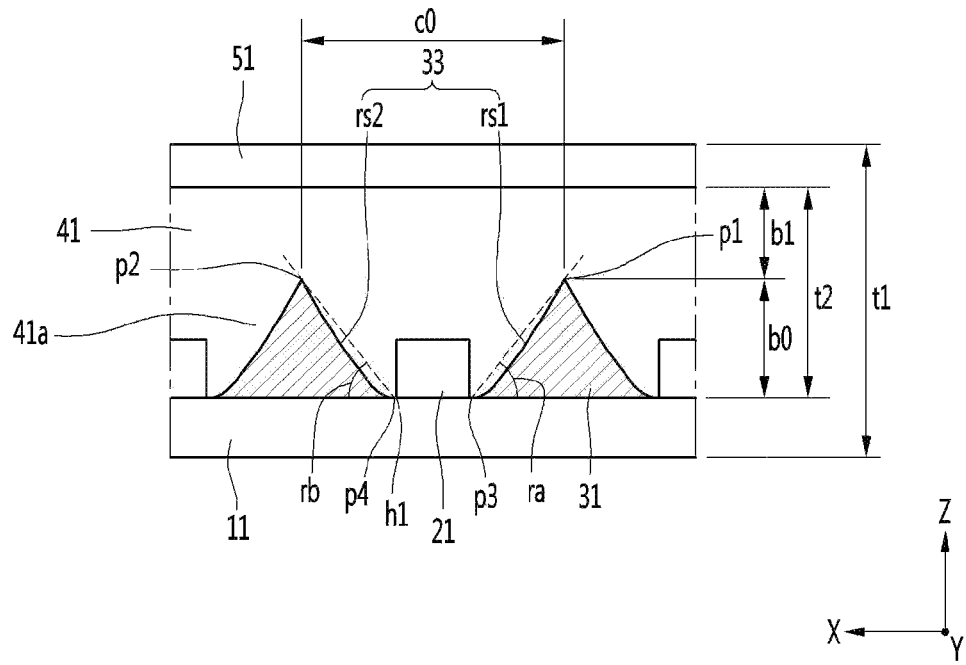
FIG. 3 is a partially enlarged view for explaining a reflective member of the lighting module of FIG. 2.

FIG. 1 is a plan view showing a lighting module according to an embodiment of the invention, FIG. 2 is an example of a cross-sectional view on the A-A side of the lighting module of FIG. 1, and FIG. 3 is a partially enlarged view for explaining a reflective member of the lighting module of FIG. 2.

Referring to FIGS. 1 to 3, the lighting module 100 includes a substrate 11, a light emitting device 21 disposed on the substrate 11, a reflective member 31 around the light emitting device 21, and a resin layer 41 covering the light emitting device 21 on the substrate 11. The lighting module 100 may include a phosphor layer 51 on the resin layer 41.

The lighting module 100 may emit light emitted from the light emitting device 21 to a surface light source. The lighting module 100 may include a reflective layer disposed on the substrate 11. In the lighting module 100, a plurality of light emitting devices 21 may be arranged in N columns (N is an integer greater than or equal to 1). The plurality of light emitting devices 21 may be arranged in N columns and M rows (N and M are integers of 2 or more) as shown in FIG. 1. The lighting module 100 may be applied to various lamp devices that require lighting, such as vehicle lamps, home lighting devices, and industrial lighting devices. For example, in the case of lighting modules applied to vehicle lamps, it may be applied to head lamps, side mirror lights, position lamps, fog lights, tail lamps, turn signal lamps, back up lamps, stop lamps, daytime running right, vehicle interior lighting, door scarf, rear combination lamp, and backup lamp. The lighting module 100 may be provided as a flexible module in the form of being assembled to a bracket having an inclined or curved surface or a housing.

The lighting module 100 may emit at least one of green, blue, yellow, white, or red light. For example, the lighting module 100 may emit red light.

The substrate 11 includes a printed circuit board (PCB), for example, a resin-based printed circuit board (PCB), a metal core PCB, a flexible PCB, and a ceramic PCB or FR-4 PCB. The substrate 11 may include, for example, a flexible PCB. The upper surface of the substrate 11 has a plane of X-axis and Y-axis direction, and the thickness of the substrate 11 may be a height in the Z direction orthogonal to the X and Y directions. Here, the X direction may be a first direction, the Y direction may be a second direction orthogonal to the X direction, and the Z direction may be a third direction orthogonal to the X and Y directions.

The substrate 11 may include a wiring layer (not shown) thereon, and the wiring layer may be electrically connected to the light emitting device 21. The plurality of light emitting devices 21 may be connected in series, parallel, or series-parallel by the wiring layer. The substrate 11 may function as a base member or a support member located under the light emitting device 21, the resin layer 41 and the reflective member 31.

The length of the substrate 11 in the X direction and the length in the Y direction may be the same or different from each other. The thickness of the substrate 11 may be 0.5 mm or less, for example, in the range of 0.3 mm to 0.5 mm. Since the thickness of the substrate 11 is provided to be thin, the thickness of the lighting module may be reduced. The thickness t1 of the lighting module 100 may be 5.5 mm or less from a bottom of the substrate 11, for example, in a range of 4.5 mm to 5.5 mm or 4.5 mm to 5 mm. The thickness t1 of the lighting module 100 may be a straight distance between the lower surface of the substrate 11 and the upper surface of the phosphor layer 51. The thickness t1 of the lighting module 100 may be 220% or less, for example, in a range of 180% to 220% of the thickness t2 of the resin layer 31. When the thickness t1 is thinner than the above range, the lighting module 100 may reduce the light diffusion space and generate a hot spot, and when the thickness is greater than the above range, the lighting module 100 may increase a spatial installation restrictions and design freedom due to an increase of the thickness. According to an embodiment of the invention, since the thickness t1 of the lighting module 100 is 5.5 mm or less, for example, 5 mm or less, a curved structure is possible, so that design freedom and space restrictions may be reduced.

The substrate 11 may be provided with a connector in a part to supply power to the light emitting devices 21. A region on the substrate 11 in which the connector is disposed may be a region in which a resin layer is not formed. The substrate 11 may have a rectangular top-view shape, a square shape, or another polygonal shape. The substrate 11 may have a straight or curved bar shape.

The substrate 11 may include a protective layer or a reflective layer thereon. The protective layer or the reflective layer may include a member having a solder resist material, and the solder resist material is a white material, and may reflect incident light.

The light emitting device 21 may be disposed on the substrate 11 and sealed with the resin layer 41. The light emitting device 21 emits light through the resin layer 41. The resin layer 41 may be in contact with the surface of the light emitting device 21. The light emitting device 21 has a light exit surface and a plurality of side surfaces, and the light exit surface faces an upper surface of the resin layer 41 to emit light. The plurality of side surfaces of the light emitting device 21 may emit light. The resin layer 41 may be in contact with a light exit surface and a plurality of side surfaces of each light emitting device 21. When the phosphor layer 51 is disposed on the resin layer 41, light emitted through the resin layer 41 may be emitted through the phosphor layer 51.

The light exit surface and side surfaces of the light emitting device 21 emit light. The light emitting device 21 is an LED chip that emits light through at least five surfaces, and may be disposed on the substrate 11 in the form of a flip chip. As another example, the light emitting device 21 may include a horizontal type LED chip or a vertical type LED chip. In the case where the light emitting device 21 is a horizontal LED chip or a vertical LED chip, the LED chip may be connected to another LED chip or wiring pattern with a wire. When a wire is connected to the LED chip, the thickness of the resin layer may be increased due to the height of the wire, and the interval between the light emitting devices 21 may be increased due to the connection space according to the length of the wire. As another example, the light emitting device 21 may be provided as a package having an LED chip.

The light emitting device 21 may have a thickness of 0.3 mm or less. The light emitting device 21 according to the embodiment of the invention may increase the distribution of the angle of beam spread due to the five-sided light emission, and thus, the interval a1 between the light emitting devices 21 may be equal to or greater than the thickness t2 (t2≤a1) of the resin layer 41, for example, 2.5 mm or more, and may vary according to the LED chip size. It may be seen that the light emitting device 21 disclosed in the embodiment of the invention is provided with an LED chip that emits light on at least five surfaces, so that the luminance distribution and the distribution of angle of beam spread on each light emitting device 21 are improved.

When the light emitting devices 21 are arranged in an N×M matrix on the substrate 11, N may be one or two or more columns, and M may be one or two or more columns. The N and M are an integer of 1 or more. The light emitting devices 21 may be arranged in the Y-axis and X-axis directions, respectively.

The light emitting device 21 is a light emitting diode (LED) chip, and may emit at least one of blue, red, green, ultraviolet (UV), and infrared rays. The light emitting device 21 may emit at least one of blue, red, and green light, for example. The light emitting device 21 is electrically connected to the substrate 11 and may emit blue light in a range of 420 nm to 470 nm. The light emitting device 21 may be a light source.

The surface of the light emitting device 21 may be protected with a transparent insulating layer or a layer of a resin material. A phosphor layer having a phosphor may be formed on the surface of the light emitting device 21. The light emitting device 21 may have a support member having a ceramic support member or a metal plate disposed under the light emitting device, and the support member may be used as an electrical conduction and heat conduction member.

A plurality of layers is stacked on the light emitting device 21 according to an embodiment of the invention, and the plurality of layers may include, for example, two or more layers or three or more layers. The plurality of layers may selectively include at least two or three or more layers from among a layer without impurities, a layer to which a phosphor is added, a layer with a diffusion agent, and a layer to which a phosphor/diffuser is added. At least one of the plurality of layers may selectively include a diffusion agent and a phosphor. That is, the phosphor and the diffusion agent may be disposed in separate layers from each other, or may be mixed with each other and disposed in one layer. The impurity may be a phosphor or/and a diffusion agent. The layers including the phosphor and the diffusion agent may be disposed adjacent to each other or may be disposed spaced apart from each other. When the phosphor and the layer on which the diffusion agent is disposed are separated from each other, the layer on which the phosphor is disposed may be disposed above the layer on which the diffusion agent is disposed.

The phosphor may include at least one of a blue phosphor, a green phosphor, a red phosphor, and a yellow phosphor. The size of the phosphor may range from 1 µm to 100 µm. The higher the density of the phosphor, the higher the wavelength conversion efficiency may be, but since the luminous intensity may decrease, the phosphor may be added in consideration of the light efficiency within the size of the phosphor. The diffusion agent may include at least one of PMMA (Poly Methyl Meth Acrylate) series, $TiO_2$, $SiO_2$, $Al_2O_3$, and silicon series. The diffusion agent may have a refractive index in the range of 1.4 to 2 at the emission wavelength, and the size may be in the range of 1 to 100 µm. The diffusion agent may have a spherical shape, but is not limited thereto. The plurality of layers may include a resin material layer. The plurality of layers may have the same refractive index, at least two layers have the same refractive index, or a layer adjacent to the uppermost layer may have a gradually lower refractive index.

The lighting module 100 may include a reflective member 31. The reflective member 31 may be disposed between the substrate 11 and the resin layer 41. The reflective member 31 may be disposed on the upper surface of the substrate 11 and spaced apart from the upper surface of the resin layer 41. The reflective member 31 may be disposed in a region that does not overlap the light emitting device 21 in a vertical direction. The reflective member 31 may overlap the resin layer 41 in a vertical direction. The reflective member 31 may be adhered to the upper surface of the substrate 11 with an adhesive or may be directly adhered. The reflective member 31 may be a reflective sheet or may include a reflective resin. The reflective member 31 may add a high refractive index filler, reflector, or absorbent to a resin material containing silicone or epoxy. The filler may include at least one of PMMA (Poly Methyl Meth Acrylate) series, $TiO_2$, $SiO_2$, $Al_2O_3$, and silicon series. The filler has a refractive index in the range of 1.4 to 2 in the emission wavelength, and the size may be in the range of 4 µm to 6 µm. The reflective member 31 may have a white surface color. As another example, the reflective member 31 may be provided as an absorbing member, and the absorbing member may include a filler such as graphite in a resin material such as silicone or epoxy. Such an absorbing member absorbs light around the light emitting device, thereby preventing unnecessary light interference. For description of the invention, the reflective member 31 will be described as an example.

The reflective member 31 may be disposed around each of the light emitting devices 21. The reflective member 31 is a sidewall disposed around each of the light emitting devices 21 and may reflect incident light. An upper end of the reflective member 31 may be disposed higher than an upper end of the light emitting device 21. The height or thickness of the reflective member 31 may be greater than the height or thickness of the light emitting device 21 with respect to the upper surface of the substrate 11. Accordingly, the reflective member 31 reflects the light incident from the light emitting device 21 toward the upper surface of the light emitting device 21, and the intensity of the light on the light emitting device 21 may be increased.

Referring to FIG. 3, the reflective member 31 may include a plurality of through holes h1 through which each of the light emitting devices 21 pass. At least one light emitting device may be inserted into each of the plurality of through holes h1. As another example, two or three or more light emitting devices may be inserted into each of the through holes h1. That is, one or two or more light emitting devices may be disposed in one through hole h1. The shape of the through hole h1 may be a circular shape or a polygonal shape.

The reflective member 31 may include a plurality of reflective units 33. Each of the plurality of reflective units 33 may face a side surface of each of the light emitting devices 21. The reflective unit 33 may include a recess or cavity in which each of the light emitting devices 21 are accommodated. The number of reflective units 33 may be the same as the number of the light emitting devices 21.

The reflective unit 33 may have a circular shape or an oval shape. As another example, the reflective unit 33 may have a polygonal shape or a curved edge portion of the polygonal shape. The reflective unit 33 may include a flat or curved surface inclined based on a horizontal straight line on the upper surface of the substrate 11. The reflective unit 33 may include a reflective surface that is inclined or has a curvature. As another example, the reflective unit 33 may include a reflective surface having a multi-step structure. The reflective unit 33 of the reflective member 31 may be disposed to face side surfaces of the light emitting device 21. The reflective unit 33 of the reflective member 31 may be a sidewall reflecting light around the light emitting device 21. A detailed description of the reflective unit 33 will be described later.

An outer portion of the reflective member 31 may be disposed outside the light emitting device 21 disposed outside the substrate 11. The outer side of the reflective member 31 is a side adjacent to the outer side of the substrate 11 and may be disposed on the same plane as the outer side of the resin layer 41. In this case, the outer portion of the resin layer 41 may be spaced apart from the upper surface of the substrate 11. As another example, an outer portion of the resin layer 41 may be extended to an outer side of the reflective member 31 and may be in contact with an upper surface of the substrate 11.

The thickness b0 of the reflective member 31 may be thicker than the thickness of the light emitting device 21 and smaller than the thickness t2 of the resin layer 41. The upper end of the reflective member 31 may be higher than the upper surface of the light emitting device 21 and lower than the upper surface of the resin layer 41. The thickness b0 of the reflective member 31 may be at least 0.4 times the thickness t2 of the resin layer 41, for example, in a range of 0.4 to 0.6 times. Since the thickness b0 of the reflective member 31 is disposed within the above range, light reflection efficiency may be improved and light intensity may be increased. When the thickness b0 of the reflective member 31 is smaller than the above range, light reflection efficiency and luminous intensity may be decreased. When the thickness b0 of the reflective member 31 is greater than the above range, the angle of beam spread of light may be 40 degrees or less or a dark portion may be generated. Referring to FIG. 3, the minimum distance b1 between the upper end of the reflective member 31 and the upper surface of the resin layer 41 may be 0.5 mm or more, for example, in a range of 0.5 mm to 2 mm. The ratio of the thickness b0 of the reflective member 31 to the distance b1 may range from 2:1 to 1:2.

The thickness b0 of the reflective member 31 is provided at least twice the thickness of the light emitting device 21, so that incident light may be effectively reflected. The thickness b0 of the reflective member 31, that is, the maximum thickness may be in the range of 1 mm or more, for example, in a range of 1 mm to 3 mm.

The upper portion of the reflective member 31 may be disposed in a region between the light emitting devices 21 and may gradually increase as it is adjacent to the resin layer 41. The reflective unit 33 connected to the through hole h1 may gradually widen as it approaches the resin layer 41 from the bottom where the light emitting device 21 is disposed to the resin layer 41. That is, a width c0 or an area of the reflective unit 33 may gradually increase as it approaches the resin layer 41. The upper width c0 of the reflective unit 33 of the reflective member 31 may be smaller than the interval a1 between the light emitting devices 21. The upper width c0 of the reflective unit 33 of the reflective member 31 may be greater than the thickness b0 of the reflective member 31.

Figure 4:
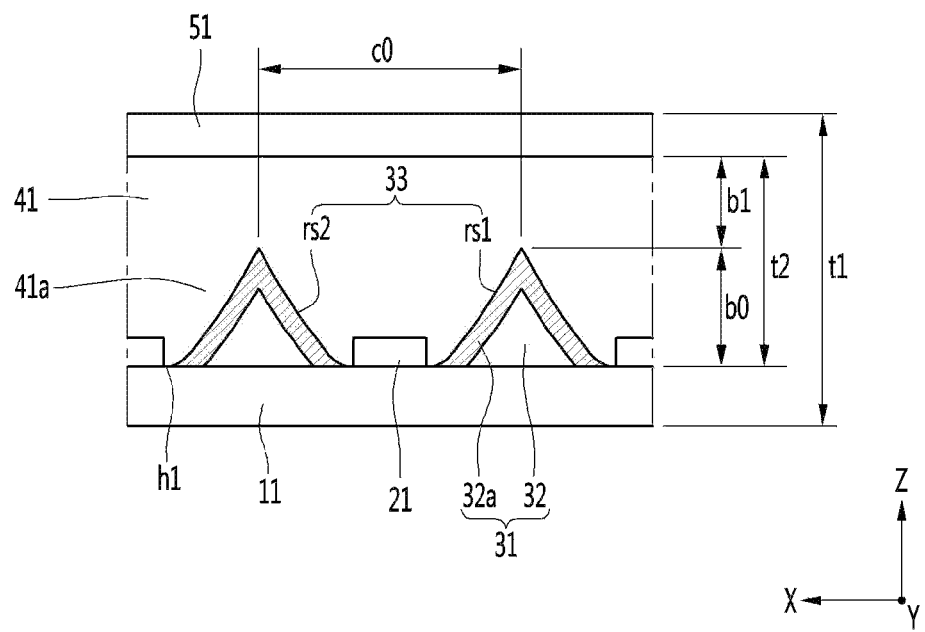
FIG. 4 is another example of the reflective member of FIG. 3.

The reflective member 31 may be formed of a reflective resin. As another example, as shown in FIG. 4, the reflective member 31 may include a resin portion 32 and a reflective layer 32a. The reflective layer 32a of the reflective member 31 may be laminated on the surface of the resin portion 32 formed of a transparent material. The reflective layer 32a may be formed of a metal or non-metal material on the resin portion 32 of epoxy or silicone. The resin portions 32 may be arranged in a matrix shape such that a plurality of the resin portions 32 are spaced apart from each other or may be crossed in a length and breadth directions. The resin portion 32 may have a triangular cross-section. The resin portion 32 may have an upper height higher than the upper height of the light emitting device 21. The reflective layer 32a may be formed as a reflective region having a concave curved surface on the surface of the resin portion 32. Since the reflective layer 32a is laminated on the surface of the resin portion 32, the amount or area of the reflective layer 32a may be reduced compared to the reflective member of FIG. 2. The surface structure of the reflective member 31 may be applied to the structure of another example.

The resin layer 41 may be disposed on the substrate 11. The resin layer 41 seals the light emitting device 21 on the substrate 11. The resin layer 41 may be adhered to the upper surface of the substrate 11. The resin layer 41 may be adhered to the upper surface of the substrate 11 with an adhesive or may be directly adhered. The resin layer 41 seals the reflective member 31. The resin layer 41 may contact the surface of the reflective member 31. The lower portion 41a of the resin layer 41 may protrude into the reflective unit 33 of the reflective member 31. The lower portion 41a of the resin layer 41 may be disposed between the reflective member 31 and the light emitting device 21. The lower portion 41a of the resin layer 41 may contact the upper surface of the substrate 11 through a region between the reflective member 31 and the light emitting device 21.

The resin layer 41 may have a thickness greater than that of the light emitting device 21. The upper surface of the resin layer 41 may be disposed higher than the upper end of the reflective member 31. The thickness t2 of the resin layer 41 may be thicker than the thickness of the substrate 11, and may be 5 times or more, for example, in a range of 5 to 10 times thicker than the thickness of the substrate 11. Since the resin layer 41 is disposed at the thickness t2, the resin layer 41 seals the light emitting device 21 on the substrate 11, prevents moisture penetration, and supports the substrate 11. The resin layer 41 and the substrate 11 may be formed of a flexible plate. The thickness t2 of the resin layer 41 may be 4 mm or less, for example, in a range of 2 mm to 4 mm or 2 mm to 3.5 mm.

The resin layer 41 may be a transparent resin material, for example, a resin material such as UV (Ultra violet) resin, silicone, or epoxy. The refractive index of the resin layer 41 may be 1.8 or less, for example, in a range of 1.1 to 1.8 or 1.4 to 1.6, and may be lower than the refractive index of the diffusion agent. The UV resin may be, for example, a resin (oligomer type) containing a urethane acrylate oligomer as a main material. For example, the UV resin may use a synthetic oligomer urethane acrylate oligomer. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photo initiator to be able to perform a function of initiating photo reactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The resin layer 41 may include a diffusion agent. When the resin layer 41 has the diffusion agent, light traveling in an emission direction is diffused, and uniformity of light source distribution may be improved. Here, the diffusion agent of the resin layer 41 may be in the range of 5 wt % or less, for example, in a range of 2 wt % to 5 wt %. When the content of the diffusion agent is smaller than the above range, there is a limit to lowering the hot spot, and when the content is larger than the above range, the light transmittance may decrease. As another example, the resin layer 41 may include a layer to which impurities such as a diffusion agent are not added. Since the resin layer has no impurities, light may be transmitted with straightness.

When the resin layer 41 has a diffusion agent, the resin layer 41 may suppress the occurrence of hot spots due to the emitted light. The diffusion agent may have a size larger than the wavelength of light emitted from the light emitting device 21. Since such a diffusion agent has a size larger than the wavelength and is disposed, the light diffusing effect may be improved. The resin layer 41 may extend to an outermost side of the reflective member 31 or a side portion 51a of the phosphor layer 51 may extend.

The phosphor layer 51 may be disposed on the resin layer 41. The phosphor layer 51 may be disposed on the upper surface of the resin layer 41. The side portion 51a of the phosphor layer 51 may be disposed on the side surface of the resin layer 41. The side portion 51a of the phosphor layer 51 may be disposed on a side surface of the outer portion of the reflective member 21. The side portion 51a of the phosphor layer 51 may be adhered to the upper surface of the substrate 11. Here, the side portion 51a of the phosphor layer 51 may be removed, and in this case, the side surface of the resin layer 41 may be exposed from the phosphor layer 51. In addition, when the side portion 51a of the phosphor layer 51 is removed, the side surface of the outer portion of the reflective member 31 may be exposed.

The side portion 51a of the phosphor layer 51 extends to the outer side of the resin layer 41 and the reflective member 31 and contacts the upper surface of the circuit board 11, so that moisture penetration may be prevented. The side portion 51a of the phosphor layer 51 may emit wavelength-converted light. The phosphor layer 51 may include the same phosphor or different phosphors on an upper region disposed on an upper surface of the resin layer 41 and a region of the side portion 51a. For example, a first phosphor may be added to an upper region, and a second phosphor may be added to the side portion 51a. The first phosphor is a red phosphor, and the second phosphor may include at least one of red, green, yellow, and blue.

The phosphor layer 51 may be a material different from or the same material as the resin material of the resin layer 41. The phosphor layer 51 may include a transparent resin material, and may include a phosphor therein. The phosphor layer 51 may include one or more types of phosphors, such as at least one of a red phosphor, a green phosphor, a blue phosphor, and a yellow phosphor. The phosphor layer 51 may include a red phosphor. The phosphor layer 51 may convert the wavelength of incident light by including the phosphor therein. Here, when the light emitted from the light emitting device 21 is the first light and the light converted from the phosphor layer 51 is the second light, the second light may have a longer wavelength than the first light. The second light may have a luminous intensity greater than that of the first light. Since the phosphor layer 51 has a high content of the phosphor, most of the first light may be converted into a second light. The luminous intensity of the second light converted by wavelength through the phosphor layer 51 may be higher than the luminous intensity of the first light. When turned on or not, the surface color of the phosphor layer 51 may be a red color or a color adjacent to red color. When turned on or not, the surface color of the phosphor layer 51 may be a color adjacent to a color of the phosphor.

The phosphor layer 51 may include the above-described phosphor and a plurality of ink particles. The ink particles may be green, red, or red particles, for example, red particles. The phosphor of the phosphor layer 51 and the ink particles may have the same color series, for example, red series.

The phosphor layer 51 may include a material such as silicon or epoxy. The phosphor layer 51 may have a refractive index in the range of 1.45 to 1.6. The phosphor layer 51 may have a refractive index equal to or higher than that of a diffusion agent. The phosphor layer 51 may be higher than the refractive index of the resin layer 41. When the refractive index of the phosphor layer 51 is lower than the above range, the uniformity of light is lowered, and when it is higher than the above range, the light transmittance may decrease. Accordingly, the refractive index of the phosphor layer 51 is provided in the above range, so that the light transmittance and the light uniformity may be adjusted. Since the phosphor layer 51 has a phosphor therein, it may be defined as a layer that diffuses light.

The content of the phosphor may be added in an amount or ratio substantially equal to that of the resin material forming the phosphor layer 51. The phosphor layer 51 may be mixed in a ratio of a resin material and a phosphor in a ratio of, for example, in a range of 4:6 to 6:4. The phosphor may range from 40 wt % to 60 wt % in the phosphor layer 51. The content of the phosphor may have a difference of 20% or less or 10% or less with respect to an amount of a resin in the phosphor layer 51. In the embodiment, by adding the phosphor content in the phosphor layer 51 at a ratio of 40% or more or 60% or less, the color on the surface of the phosphor layer 51 may be provided as the color of the phosphor. It may improve the diffusion and wavelength conversion efficiency. In addition, transmission of the wavelength of light emitted from the light emitting device 21 through the phosphor layer 51, for example, blue light may be reduced. In addition, the light extracted through the phosphor layer 51 may be provided as a surface light source according to the wavelength of the phosphor.

The phosphor layer 51 may be provided in the form of a film by, for example, adding a phosphor in a silicone material and then curing it. The phosphor layer 51 may be formed directly on the resin layer 41 or may be separately formed and then adhered. The phosphor layer 51 manufactured in the form of a film may be adhered to the upper surface of the resin layer 41. An adhesive may be disposed between the phosphor layer 51 and the resin layer 41. The adhesive is a transparent material, and may be an adhesive such as UV adhesive, silicone or epoxy. Since the phosphor layer 51 is provided in the form of a film, it is possible to provide a uniform distribution of the phosphor inside, and the color sense of the surface color may be provided at a certain level or higher. By using a film made of a resin material for the phosphor layer 51, a module having high ductility may be provided as compared to the case of using a polyester (PET) film. The phosphor layer 51 may be a protective film having a phosphor or a release film having a phosphor. The phosphor layer 51 may be provided as a film attachable or detachable from the resin layer 41.

The phosphor layer 51 may have a thickness t3 (t3<t2) smaller than the thickness t2 of the resin layer 41. The phosphor layer 51 may have a thickness of 0.5 mm or less, for example, in a range of 0.3 mm to 0.5 mm. The thickness t3 of the phosphor layer 51 may be 25% or less of the thickness t2 of the resin layer 41. The thickness t3 of the phosphor layer 51 may be 18% or less of the thickness t2 of the resin layer 41, for example, in the range of 14% to 18%. When the thickness t3 of the phosphor layer 51 is thicker than the above range, the light extraction efficiency may decrease or the module thickness may increase. When it is smaller than the above range, it is difficult to suppress hot spots or the wavelength conversion efficiency may decrease. In addition, the phosphor layer 51 is a layer for wavelength conversion and external protection, and when it is thicker than the above range, the ductility characteristics of the module may be deteriorated, and design freedom may be lowered.

The phosphor converts the light emitted from the light emitting device 21 to wavelength. When the phosphor is a red phosphor, the light is converted into red light. Light is uniformly diffused through a diffusion agent added to the resin layer 41 so that most of the light emitted from the light emitting device 21 may be converted to wavelength, and the phosphor layer may convert the diffused light into wavelength. Since the phosphor layer 51 includes a phosphor, an external color may be shown as the color of the phosphor. For example, when the phosphor is red, the surface color may be seen as red, so when the light emitting device 21 is turned off, a red image may be provided, and when the light emitting device 21 is turned off, a red light having a predetermined luminous intensity is diffused to provide a red image of a surface light source. As another example, a layer having the same color as the phosphor or a darker color sense than the phosphor may be further disposed on the surface of the phosphor layer 51. That is, when a red phosphor is added, an ink layer having red ink particles may be formed on the surface.

Figure 12A:
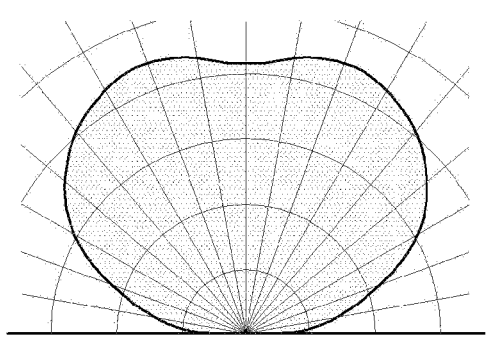
FIGS. 12A and 12B are a comparative example and an example of a distribution of an angle of the beam spread of each light emitting device of a lighting module having a reflective member.
Figure 12B:
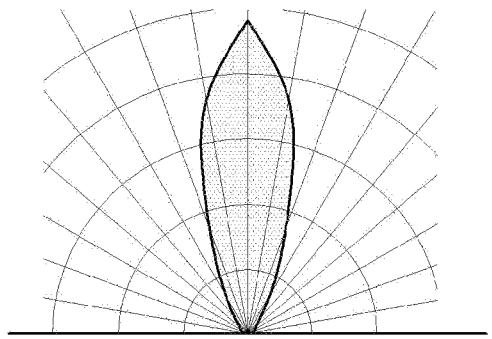

The lighting module 100 according to the embodiment may have a thickness of 5.5 mm or less, emit a surface light source through an upper surface, and may have flexible characteristics. The lighting module 100 may emit light through a side surface. In the lighting module according to the embodiment of the invention, when there is no reflective member as shown in (a) of FIG. 12 (comparative example), the distribution of angle of the beam spread of light on the light emitting device may be 120 degrees or more, for example, in a range of 120 degrees to 135 degrees. As shown in (b) of FIG. 12, when the reflective member according to the embodiment is provided, the distribution of the angle of the beam spread of light on the light emitting device may be 80 degrees or less, for example, in the range of 40 degrees to 80 degrees. That is, by providing the reflective member around the light emitting device 21, the luminous intensity of the individual light emitting devices may be improved compared to the comparative example.

When the lighting module 100 according to the embodiment is assembled on a curved or inclined bracket, a distribution of light intensity in a curved region and a non-bent region may be different, and a dark part may be generated in a specific region. According to an exemplary embodiment of the invention, reflected light may be differently provided so that light is irradiated in the same direction according to the assembly environment of the lighting module 100 using the reflective member 31.

Figure 5:
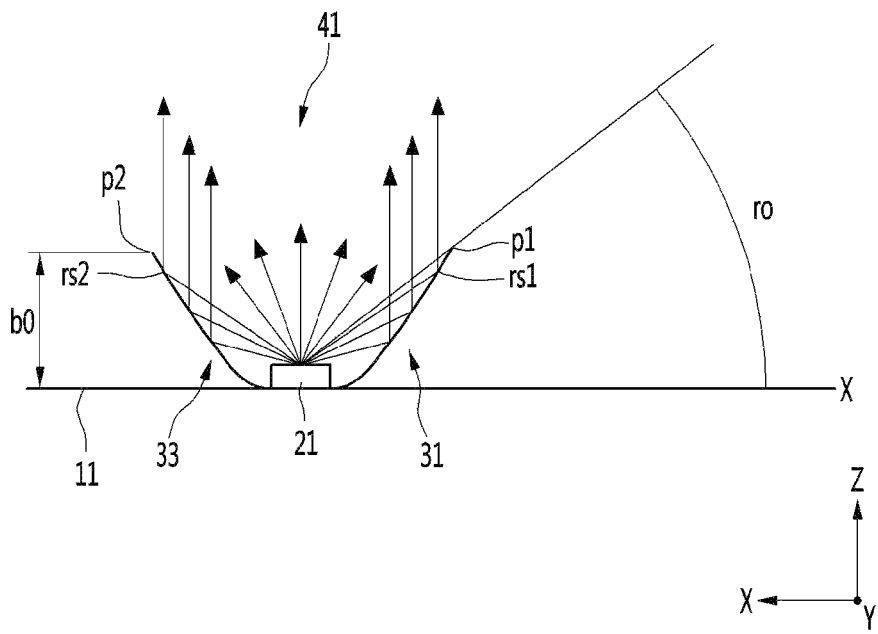
FIG. 5 is a view illustrating a structure of a reflective member of the lighting module of FIG. 3.
Figure 13:
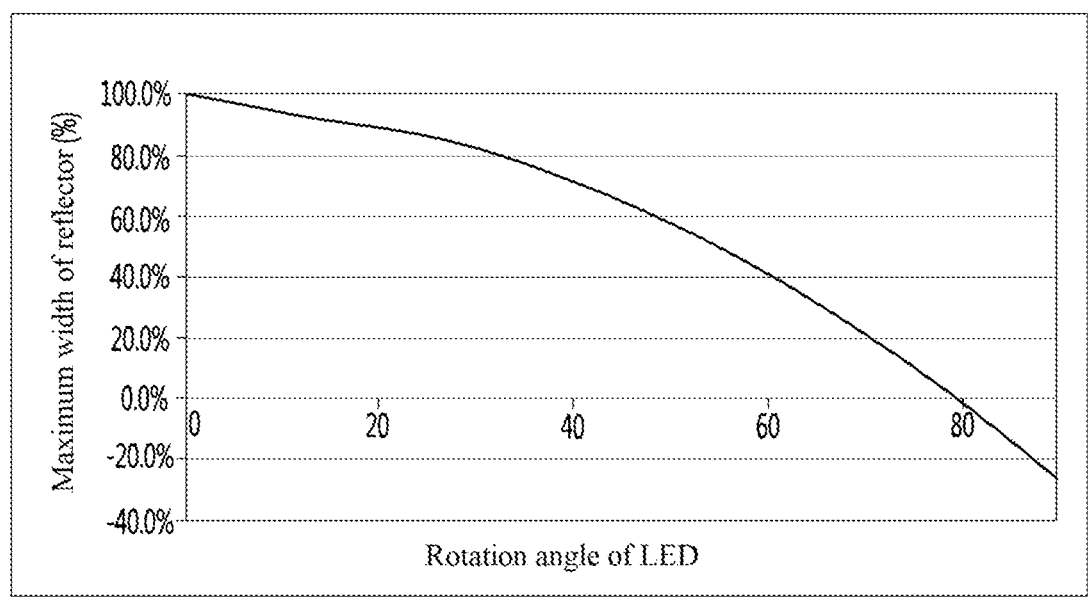
FIG. 13 is a graph comparing a maximum width of a reflective member according to a rotation angle of a light emitting device in a lighting module according to an embodiment of the invention.

Referring to FIGS. 3 and 5, the reflective member 31 may include a plurality of reflective units 33. Each of the plurality of reflective units 33 may include first and second reflective regions rs1 and rs2 facing each other in the first direction X. Each of the plurality of reflective units 33 may include third and fourth reflective regions (not shown) facing each other in the second direction Y, and the third and fourth reflective regions refer to a description of the first and second reflective regions rs1 and rs2. The first reflective region rs1 may be disposed on one side or a right side with respect to the light emitting device 21, and the second reflective region rs2 may be disposed on the other side or a left side with respect to the light emitting device 21. The first reflective region rs1 may face one side of the light emitting device 21, and the second reflective region rs2 may face the other side of the light emitting device 21. The first and second reflective regions rs1 and rs2 may be disposed on opposite sides of each other with respect to a center line perpendicular to the light emitting device 21 and may face each other. The reflective unit 33 may be a reflective surface of the reflective member 31 and may be defined as a reflective unit or an inclined surface. As shown in FIG. 3, the upper width c0 of the reflective unit 33 may be the same as the distance between the light emitting devices 21. That is, in the horizontal lighting module, the upper widths c0 of the reflective units 33 may be the same. However, in the lighting module having a predetermined curvature, the upper width c0 of the reflective unit 33 may be different from each other in a horizontal region and a curvature region. In this case, when the lighting module includes a region having a curvature and a region having no curvature, it is difficult to irradiate a surface light source having a uniform distribution onto the lighting module. In an embodiment of the invention, the upper width c0 of the reflective unit 33 for irradiating a uniform surface light source may be narrower in a region having a curvature than a region having no curvature. Here, as shown in FIG. 13, the upper width c0 of the reflective unit 33 may become gradually narrower as the rotation, inclination or tilted angle of the LED, that is, the light emitting device 21 become gradually greater.

Referring to FIG. 3, the first reflective region rs1 may be a region between a first uppermost point p1 disposed in the other direction with respect to the light emitting device 21 and a first point p3 in contact with the substrate 11. The first reflective region rs1 may be disposed on the same line as a straight line connecting the first uppermost point p1 and the first point p3, or may be disposed more concave than the straight line. The first reflective region rs1 may include a flat inclined surface or a concave curved surface. Here, the first angle ra between the substrate 11 and the straight line connecting the first uppermost point p1 of the first reflective region rs1 and the first point p3 may be in a range of 10 degrees to 80 degrees.

The second reflective region rs2 may be a region between a second uppermost point p2 disposed in the other direction with respect to the light emitting device 21 and a second point p4 in contact with the substrate 11. The second reflective region rs2 may be disposed on the same line as a straight line connecting the second uppermost point p2 and the second point p4, or may be disposed more concave than the straight line. The second reflective region rs2 may include a flat inclined surface or a concave curved surface. Here, the second angle rb between the substrate 11 and the straight line connecting the second uppermost point p2 of the second reflective region rs2 and the second point p4 may be in a range of 10 degrees to 80 degrees.

At least one or two or more of the plurality of reflective units 33 may have the same first and second angles ra and rb. When the first and second angles ra and rb are the same, the first and second angles ra and rb are arranged in a range of 30 degrees to 60 degrees to reflect incident light upward. When the first and second angles ra and rb are the same, the reflective unit 33 may be disposed on a horizontal region of the substrate 11.

At least one or two or more of the plurality of reflective units 33 may have the first and second angles ra and rb different from each other. For example, the first angle ra may be larger than the second angle rb, in which case the position of the first uppermost point p1 on a horizontal straight line may disposed lower than the second uppermost point p2. As another example, the second angle rb may be greater than the first angle ra, and in this case, the position of the second uppermost point p2 on a horizontal straight line may be disposed lower than the first uppermost point p1. Here, when the positions of the first and second uppermost points p1 and p2 are different from each other, the reflective unit 33 may be a unit disposed in an inclined region or a curved region of the illumination module has the substrate 11.

At least one or two or more of the plurality of reflective units 33 may have the same curvature of the first and second reflective regions rs1 and rs2. When the first and second reflective regions rs1 and rs2 have the same curvature, the reflective unit 33 may be disposed on a horizontal region of the substrate 11.

Figure 7:
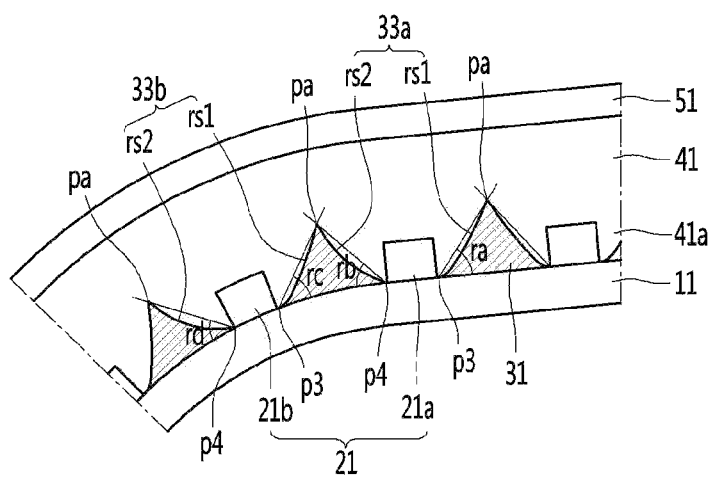
FIG. 7 is a diagram illustrating a structure of a reflective member in the lighting module of FIG. 6.
Figure 7:
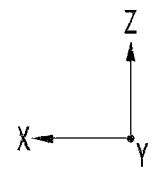

At least one or two or more of the plurality of reflective units 33 may have different curvatures of the first and second reflective regions rs1 and rs2. As shown in FIG. 7, when the first and second reflective regions rs1 and rs2 have different curvatures, the reflective units 33a and 33b may be inclined or disposed on a curved region of the substrate 11. Here, the first and second angles in the bent or bent region of the substrate 11 may be based on a tangent line of the substrate 11. The radius of curvature of the first reflective region rs1 may be larger than the radius of curvature of the second reflective region rs2, and in this case, the second uppermost point p2 on a horizontal straight line may be disposed lower than the first top point p1. The reflective units 33a and 33b having such the structure may be disposed in a region in which the other side or left side region of the substrate 11 may be bent lower or arranged in the inclined region based on a horizontal straight line. The radius of curvature of the second reflective region rs2 may be larger than the radius of curvature of the first reflective region rs1, and in this case, the first uppermost point p1 may be lower than the second top point p2 on a horizontal straight line. The reflective units 33a and 33b having such the structure may be disposed in a region in which a right side region of the substrate 11 may be bent lower or arranged the inclined region based on a horizontal straight line. The lighting module according to the embodiment of the invention may include at least one or two or more of a horizontal region, a region that is bent lower in the left side or the other side direction, a region inclined lower in the left side or other side direction, a region that is lower in the right side or one side direction, and a region inclined lower in the right side or one side direction. According to an exemplary embodiment of the invention, a region having a low left or other direction and a direction of light emitted from the horizontal region may be the same. Alternatively, a region having a lower right or one side direction and a direction of light emitted on the horizontal region may be the same. Accordingly, it is possible to suppress the formation of the directional distribution of light in different directions in the application environment of the flexible lighting module, thereby improving the reliability of the lighting module.

As shown in FIG. 5, an angle r0 between a center of the upper surface of the light emitting device 21 and a straight line horizontal to the upper surface of the substrate 11 may be smaller than the first angle ra. At this time, the first uppermost point p1 and the second uppermost point p2 may be disposed at the same height. The angle r0 may be 55 degrees or less, for example, in a range of 35 to 55 degrees.

Figure 6:
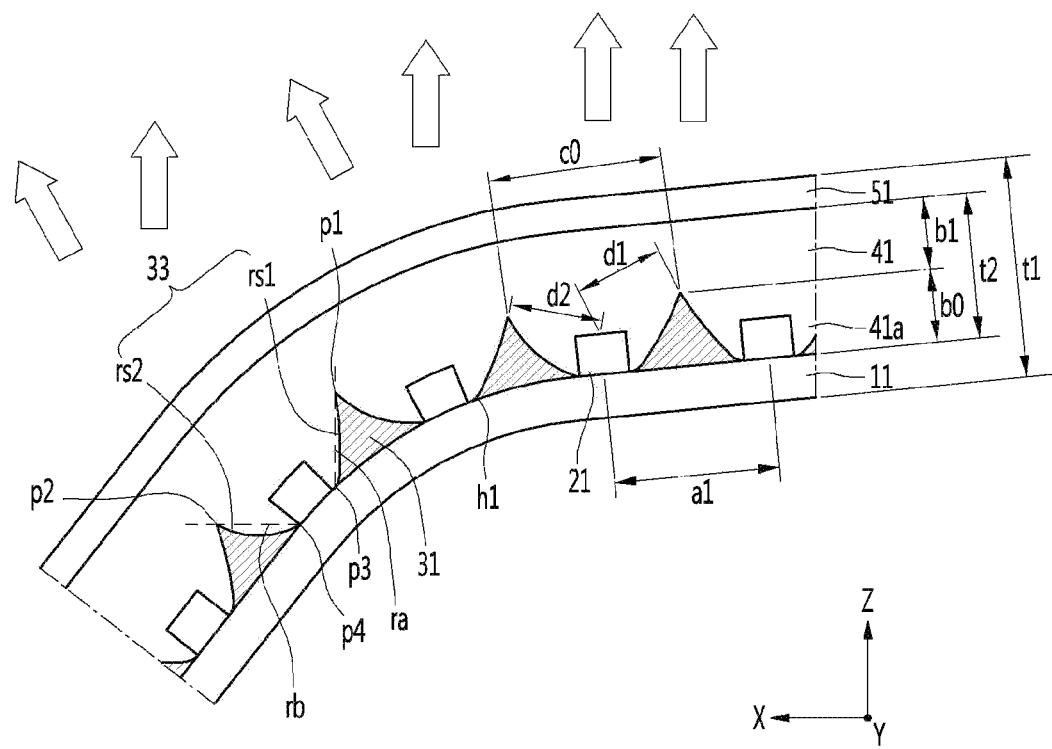
FIG. 6 is a modified example of a lighting module according to an embodiment of the invention.

Referring to FIG. 6, the interval a1 between the plurality of light emitting devices 21 disposed in the plurality of reflective units 33 may be the same. Here, the interval a1 between the light emitting devices 21 may be a distance between the centers of two adjacent light emitting devices 21. In a region where the substrate 11 is horizontal, the first uppermost point p1 and the second uppermost point p2 of the reflective unit 33 in any one the reflective unit 33 may be the same distance as the center of the upper surface of the light emitting device 21. In a region where the substrate 11 is bent or inclined, the first uppermost point p1 and the second uppermost point p2 of any one reflective unit 33 may be disposed at different distances d1 and d2 from the center of the upper surface of the light emitting device 21. For example, the distance d1 between the first uppermost point p1 and the center of the upper surface of the light emitting device 21 may be greater than the distance d2 (d2>d1) between the second uppermost point p2 and the center of the upper surface of the light emitting device 21. The reflective unit 33 having such a structure may be disposed in a region in which a region of the left side or other side direction of the substrate 11 may be bent lower or inclined based on a horizontal straight line. As another example, the distance between the second uppermost point p2 and the center of the upper surface of the light emitting device 21 may be greater than the distance between the first uppermost point p1 and the center of the upper surface of the light emitting device 21. The reflective unit 33 having such a structure may be disposed in a region in which a region of a right side or one side direction of the substrate 11 may be bent lower or inclined based on a horizontal straight line.

As shown in FIGS. 3 and 6, in a region in which the substrate 11 is horizontal, inclined or bent, the first and second points p3 and p4 disposed around the through hole h1 of the reflective member 31 may be spaced at the same interval from the center of the light emitting device 21 or from the side surface of the light emitting device 21. At least one or two or more of the reflective units 33 may have a first angle ra between a straight line connecting the first uppermost point p1 of the first reflective region rs1 and the first point p3 where the substrate 11 and the first reflective region rs1 are in contact with each other and a tangent line of the substrate 11 at the first point p3. A second angle rb may be formed between a straight line connecting the second uppermost point p2 of the second reflective region rs2 and a second point p4 where the substrate 11 and the second reflective region rs2 are in contact with each other and a tangent line of the substrate 11 at the second point p4. In this case, the first angle ra and the second angle rb may be different from each other, for example, the first angle ra may be smaller than the second angle rb. The sum of the first angle ra and the second angle rb may range from 80 degrees to 100 degrees. The first angle ra is 45 degrees or more, or is in the range of 10 to 55 degrees, and the second angle rb may be in the range of 45 to 80 degrees. Here, the angle between the horizontal straight line and the tangent line of the substrate 11 in the reflective unit 33 (that is, the inclination angle of the substrate) may range from 0 degrees to 80 degrees, and when the inclination angle of the substrate 11 is increased, the first angle ra decreases and the second angle rb increases. The first angle ra gradually decreases in a range from 10 degrees to 55 degrees according to the position of the reflective unit 33, and the second angle rb may gradually increase from 45 degrees to 95 degrees. When the first and second angles ra and rb of each reflective unit 33 are smaller than the above range, light control may be difficult, and when it is larger than the above range, light efficiency may be deteriorated.

As shown in FIG. 6, a straight line in a horizontal direction is a reference line, and the height of the reference line passing in the horizontal direction at the interface between the light emitting device 21 and the substrate 11 disposed on the curved surface of the substrate 11 may be different from each other. An angle between the reference line and a center line perpendicular to the center of an upper surface of each light emitting device 21 disposed on the curved surface of the substrate 11 may be different from each other. The center line may be a straight line extending in a normal direction perpendicular to a tangent line in contact between the substrate 11 and the light emitting device 21. An angle between the reference line and a center line passing through each of the light emitting devices 21 on the curved surface of the substrate 11 may be less than 90 degrees. The angle between the reference line and the center line of each light emitting device 21 may be smaller as the distance from the flat region of the substrate 11 increases.

As shown in FIG. 3, among the plurality of reflective units, the reflective units disposed at the same height on a horizontal straight line may have the same first and second angles ra and rb. In this case, the height of the upper surface of the first reflective region rs1 and the height of the upper surface of the second reflective region rs2 may be the same.

As shown in FIG. 7, among the plurality of reflective units, when two adjacent reflective units are referred to as first and second reflective units 33a and 33b, the first angle ra of the first reflective unit 33a and the second angle rb of the second reflective unit 33b may be different from each other. In this case, the first and second reflective units 33a and 33b may be disposed at different heights with respect to a horizontal straight line, that is, a reference line. The upper end region in contact with a first reflective region rs1 of the second reflective unit 33b disposed on one side of the second light emitting device 21b and a second reflective region rs2 of the first reflective unit 33a disposed on the other side of the first light emitting device 21a may include the same uppermost point Pa. That is, one uppermost point pa may be the first and second uppermost points of two adjacent reflective units 33a and 33b.

Here, a first tilt angle between a horizontal reference line on the substrate 11 on which the first light emitting device 21a is disposed and a center line passing through the center of the upper surface of the first light emitting device 21a in a vertical direction may be less than 90 degrees. The second tilt angle between a horizontal reference line on the substrate 11 on which the second light emitting device 21b is disposed and the center line passing through the center of the upper surface of the second light emitting device 21b in a vertical direction may be less than 90 degrees. The second tilt angle at this time may be smaller than the first tilt angle.

A first distance from at least one or two or more reflective units 33 disposed in the inclined or bent region of the substrate 11 to the uppermost point of the first reflective region rs1 based on the center of the upper surface of the light emitting device 21 may be different from the second distance to the uppermost point of the second reflective region rs2. For example, the first distance may be greater than the second distance.

The first reflective unit 33a of the reflective member 31 may be disposed in a right side or one side direction than the second reflective unit 33b. At least a portion of the first reflective unit 33a may be disposed at a higher position than the second reflective unit 33b based on a horizontal straight line. The first and second reflective units 33a and 33b may be disposed in an inclined or curved region. The first reflective unit 33a may be disposed around the first light emitting device 21a, and the second reflective unit 33b may be disposed around the second light emitting device 21b.

The first and second reflective units 33a and 33b may be a point in which the uppermost point pa contacts each other adjacent reflective regions. When the angle between the straight line connecting the first and second points p3 and p4 disposed at the lower end of each of the reflective regions rs1 and rs2 and the tangent line of the substrate 11 is divided, the first reflective unit may be defined as first and second angles ra and rb, and the second reflective unit 33b may be defined as third and fourth angles rc and rd. The first and second angles ra and rb may be based on a first tangent line of a region of the upper surface of the substrate 11 disposed under the first reflective unit 33a, and the third and fourth angles rc and rd may be based on a second tangent line of a region of the upper surface of the substrate 11 disposed under the second reflective unit 33b.

The first angle ra of the first reflective region rs1 of the first reflective unit 33a may be smaller than the second angle rb of the second reflective region rs2, and the third angle rc of the first reflective region rs1 of the second reflective unit 33b may be smaller than the fourth angle rd of the second reflective region rs2. The first angle ra may be greater than the third angle rc, and the second angle rb may be greater than the fourth angle rd.

The second angle rb and the third angle rc may be the same as each other or may have a difference of 10 degrees or less. The second angle rb and the fourth angle rd are different from each other, for example, may have a difference of 1 degree or more, and may be equal to or less than the difference between the second angle rb and the third angle rc. The first and second angles ra and rb are different from each other, for example, may have a difference of 1 degree or more, and may be equal to or less than the difference between the second angle rb and the third angle. By providing different angles of the reflective regions of the first and second reflective units 33a and 33b on a region of the curved substrate 11, the distribution characteristic of light irradiated through each reflective unit is close to the light distribution on the horizontal region, and when viewed from the front of the light emitting, the occurrence of the dark portions in the curved region may be reduced. When the first and second angles ra and rb and the third and fourth angles rc and rd to each of the reflective units 33a and 33b are smaller than the above range, light control may be difficult and when it is larger than the above range, the light efficiency may be lowered.

The lighting module according to the embodiment of the invention may include a horizontal region, a curved or inclined region of the substrate 11. The bent or inclined region may include at least one or two or more of a region in which the left side or the other side is bent lower, a region in which the left side or the other side direction is inclined lower, and a region in which the right side or inclined region is bent lower, or a region in which the right side or one side direction is inclined lower, based on the light emitting devices disposed between adjacent reflective regions. According to an embodiment of the invention, an orientation direction of light emitted from a region in which the left side or other side direction is lowered and the horizontal region may be provided with the same. Alternatively, an orientation direction of light emitted from a region in which the right side or one side direction may be the same. Accordingly, it is possible to suppress the formation of the orientation directional distribution of light in different directions in the application environment of the flexible lighting module, thereby improving the reliability of the lighting module.

Figure 8:
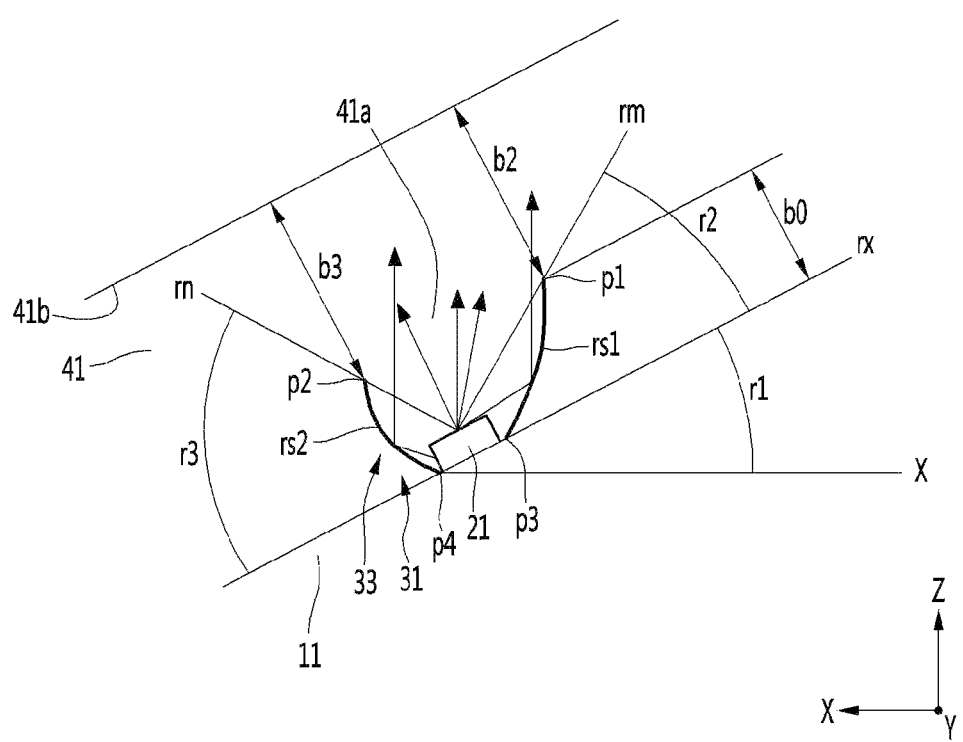
FIG. 8 is a view for explaining a structure of a reflective member and a light path in the lighting module of FIG. 6.

Referring to FIG. 8, a straight line passing through at least a partially curved region of the substrate 11 may be a tangent line rx, and a straight line in a direction horizontal to the tangent line rx may be a reference line X. A direction perpendicular to the reference line X may be a central axis Z direction. The tilt angle r1 between the reference lines based on the tangent line rx may be less than 90 degrees, for example, in a range from 1 degree to 80 degrees. At this time, a straight line rm passing through the first uppermost point p1 of the reflective unit 33 and the center of the upper surface of the light emitting device 21 may be inclined with an angle r2 based on the tangent line rx of the substrate 11, and the first inclination angle r2 may range from 10 degrees to 45 degrees. The tangent line rx is a tangent line on the curved surface of the substrate 11 in contact with a normal passing through the center of the upper surface of the light emitting device 21. Here, the first inclination angle r2 may gradually decrease from 45 degrees to 10 degrees as the tilt angle r1 decreases toward the 10 degrees. The second uppermost point p2 of the reflective unit 33 and a straight line rn passing through the center of the upper surface of the light emitting device 21 may be inclined at a second inclination angle r3 of the second reflective region rs2 based the tangent line passing through the substrate 11, and the second inclination angle r3 may include a range of 45 degrees to 80 degrees. In this case, the second inclination angle r3 may gradually increases from 45 degrees to 80 degrees as the tilt angle r1 increases toward the 80 degrees. Here, the angle of the straight line rm based on the central axis Z may be smaller than the angle of the straight line rn.

The sum of the first inclination angle r2 of the first reflective region rs1 and the second inclination angle r3 of the second reflective region rs2 may range from 85 degrees to 95 degrees. The sum of the first and second inclination angles r2 and r3 of the two reflection regions rs1 and rs2 in different reflective units may be the same. The first inclination angle r2 of the first reflective region rs1 disposed in the inclined reflective unit 33 may be smaller than the inclination angle r0 illustrated in FIG. 5. The height b0 of the first and second reflective regions rs1 and rs2 may be the same as the height of the reflective region illustrated in FIG. 5. The first and second reflective regions rs1 and rs2 may have the same distance (b2=b3) between an uppermost point and an upper surface 41b of the resin layer 41. When the first and second inclination angles r2 and r3 of the first and second reflective regions rs1 and rs2 in each reflective unit 33 are smaller than the above range, light control may be difficult, and when larger than the above range, the light efficiency may be lowered.

As an example, the first and second inclination angles r2 and r3 of the reflective unit in FIG. 8 may be applied to the reflective unit of FIG. 7. The first inclination angle r2 in the first and second reflective units 33a and 33b may be different from each other. For example, the first inclination angle r2 by the first reflective region rs1 in the first reflective unit 33a may be greater than the first inclination angle r2 by the first reflective region rs1 in the second reflective unit 33b. Likewise, the second inclination angles r3 in the first and second reflective units 33a and 33b may be different from each other. For example, the second inclination angle r3 by the second reflective region rs2 in the first reflective unit 33a may be smaller than the second inclination angle r3 by the second reflective region rs2 in the second reflective unit 33b.

As shown in FIG. 7, when a plurality of reflective units is disposed on the substrate 11, the inclination angles of the straight line passing through the first reflective regions rs1 disposed on one side of the first and second light emitting devices 21a and 21b in the first and second reflective units 33a and 33b may be defined as the first and second inclined angles. In the first and second reflective units 33a and 33b, the inclination angles of the straight lines passing through the second reflective regions rs2 disposed on the other side of the first and second light emitting devices 21a and 21b may be defined as third and fourth inclination angles. That is, the first inclination angle is an angle between a straight line passing through the uppermost point pa of the first reflective region rs1 in the first reflective unit 33a and the center of the upper surface of the first light emitting device 21 and the first tangent line of the substrate 11 on which the light emitting device 21a is disposed, and in FIG. 8, it may be the inclination angle r2. The second inclination angle is an angle between a straight line passing through the uppermost point pa of the first reflective region rs1 in the second reflective unit 33b and the center of the upper surface of the second light emitting device 21b and a second tangent line of the substrate 11 in contact with the normal line passing through the center of the upper surface of 21b of the light emitting device 21b, and in FIG. 8, it may be the inclination angle r2. The third inclination angle is an angle between a straight line passing through the uppermost point pa of the second reflective region rs2 in the first reflective unit 33a and the center of the upper surface of the first light emitting device 21a and the first tangent line, and in FIG. 8, it may be the inclination angle r3. The fourth inclination angle is an angle between a straight line passing through the center of the second light emitting device 21b and the uppermost point pa of the second reflective region rs2 in the second reflective unit 33b, and in FIG. 8, it may be an inclination angle r3. In this case, the first inclination angle (r2 in FIG. 8) of the first reflective unit 33a and the second inclination angle (r2 in FIG. 8) of the second reflective unit 33b may be different from each other. The third inclination angle of the first reflective unit 33a and the fourth inclination angle of the second reflective unit may be different from each other. The first inclination angle of the first reflective unit 33a may be greater than the first inclination angle of the second reflective unit 33b, and the third inclination angle of the first reflective unit 33a may be smaller than the fourth inclination angle of the second reflective unit 33b.

Figure 9:
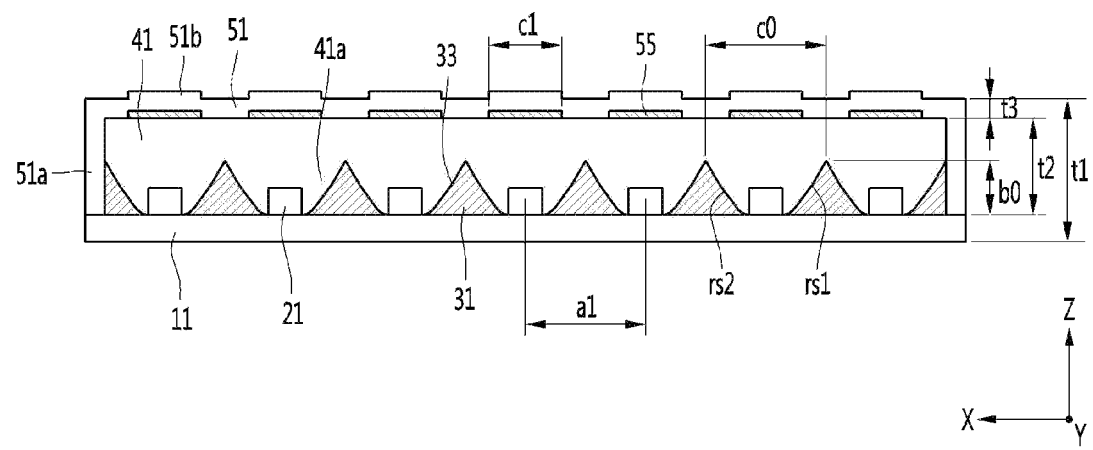
FIG. 9 is another example of a lighting module according to an embodiment of the invention.

Referring to FIG. 9, the lighting module according to an embodiment of the invention may include a light shielding portion 55. The light shielding portion 55 may be disposed between the phosphor layer 51 and the resin layer 41. As another example, the light shielding portion 55 may be disposed inside the phosphor layer 51 or may be disposed on an upper surface of the phosphor layer 51. The light shielding portion 55 may include a phosphor. The light shielding portion 55 may include a phosphor concentration higher than the phosphor concentration of the phosphor layer 51. The light shielding portion 55 may have one or more types of phosphors, and may include at least one of red, green, yellow, and blue phosphors. As another example, the light shielding portion 55 may be a region including a diffusion agent or a reflecting agent in a resin material. The light shielding portion 55 may be disposed in a region overlapping the light emitting device 21 in a vertical direction. The light shielding portion 55 may be disposed in an area of 0.5 times or more, for example, in a range of 0.5 to 5 times the area of the upper surface of the light emitting device 21. Since the light shielding portion 55 covers the upper region of the light emitting device 21, the intensity of light emitted from the light emitting device 21 may be lowered and hot spots may be suppressed. The width c1 of the light shielding portion 55 may be smaller than the upper width of the reflective unit of the reflective member 31. The width c1 of the light shielding portion 55 may be 0.5 times or more than the width of the light emitting device 21, and may be, for example, in a range of 0.5 times to 5 times. The thickness of the light shielding portion 55 may be equal to or thinner than the thickness of the phosphor layer 51. The light shielding portion 55 may be disposed through an open region of the phosphor layer 51 or may contact an upper surface of the resin layer 41. The light shielding portion 55 may have a circular top view or a polygonal shape.

A protrusion portion 51b of the phosphor layer 51 is a region overlapping the light shielding portion 55 in a vertical direction, and may further protrude than an upper surface of the phosphor layer 51. In the phosphor layer 51, a protrusion portion 51b overlapping the light shielding portion 55 may protrude more than an upper surface of the phosphor layer 51. The upper surface area of the protruding portion 51b of the phosphor layer 51 overlapping the light shielding portion 55 may be larger than the upper surface area of the light shielding portion 55. Accordingly, the light shielding portion 55 and the phosphor layer 51 convert the wavelength of incident light to emit light, and the light intensity on the light shielding region may be lowered.

Figure 10:
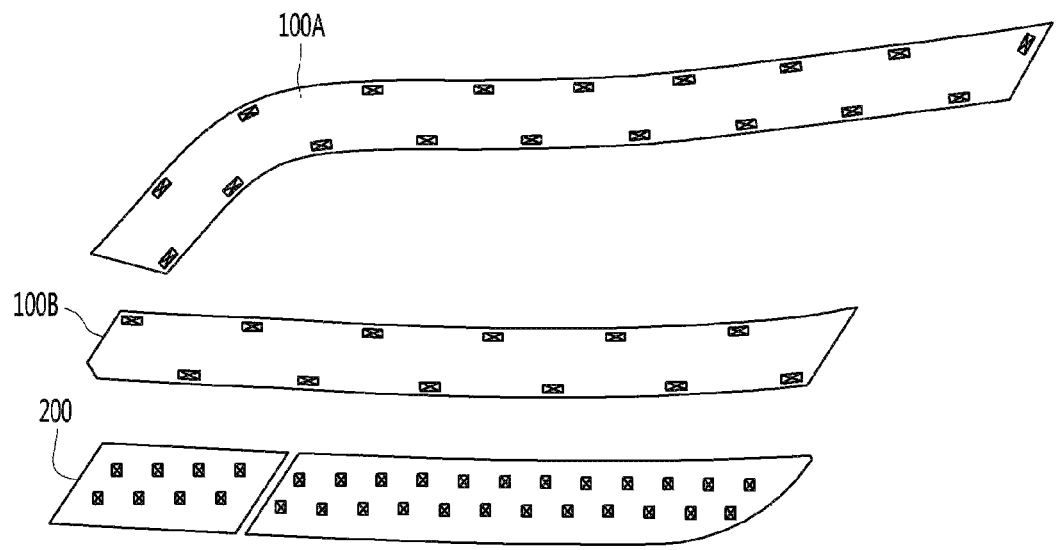
FIG. 10 is an example of a lamp showing an application example of lighting modules according to an embodiment of the invention.

The lighting module according to the embodiment may be applied to a lamp including at least one of a horizontal, bent, or inclined area. As shown in FIG. 10, the lamp may be applied in the form of various lighting modules 100A, 100B, and 200. That is, it may be provided with the linear bar-shaped lighting modules 100B and 200, or may be provided as a lighting module 100A in which a straight portion and a curved portion or an inclined portion are mixed.

Figure 11:
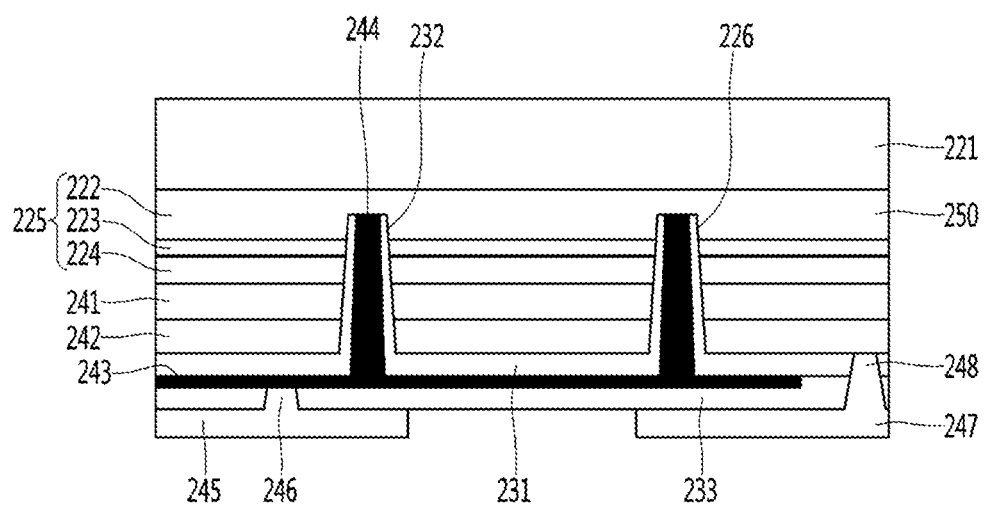
FIG. 11 is an example of a light emitting device of a lighting module according to an embodiment of the invention.

FIG. 11 is a view illustrating an example of a light emitting device of a lighting module according to an embodiment of the invention. Referring to FIG. 11, the light emitting device includes a light emitting structure 225 and a plurality of electrodes 245 and 247. The light emitting structure 225 may be formed of a compound semiconductor layer of a group II to VI element, for example, a compound semiconductor layer of a group III-V element or a compound semiconductor layer of a group II-VI element. The plurality of electrodes 245 and 247 are selectively connected to the semiconductor layer of the light emitting structure 225 and supply power. The light emitting device may include a light-transmitting substrate 221. The light-transmitting substrate 221 is disposed on the light emitting structure 225. The light-transmitting substrate 221 may be, for example, a light-transmitting, insulating, or conductive substrate. The light-transmitting substrate 221 may be, for example, at least one of sapphire ($Al_2O_3$), SiC, Si, GaAs, GaN, ZnO, Si, GaP, InP, Ge, and $Ga_2O_3$. A plurality of convex portions (not shown) is formed on at least one or both of the upper surface and the bottom surface of the light-transmitting substrate 221, thereby improving light extraction efficiency. The side cross-sectional shape of each convex portion may include at least one of a hemispherical shape, a semi-elliptic shape, or a polygonal shape. The translucent substrate 221 may be removed, but is not limited thereto.

At least one of a buffer layer (not shown) and a low conductivity semiconductor layer (not shown) may be included between the light-transmitting substrate 221 and the light emitting structure 225. The buffer layer is a layer for mitigating a difference in lattice constant between the translucent substrate 221 and the semiconductor layer, and may be selectively formed from group II to group VI compound semiconductors. An undoped Group III-V compound semiconductor layer may be further formed under the buffer layer, but the embodiment is not limited thereto. The light emitting structure 225 may be disposed under the light-transmitting substrate 221 and includes a first conductive type semiconductor layer 222, an active layer 223, and a second conductive type semiconductor layer 224. Another semiconductor layer may be further disposed on at least one of the top and bottom of each of the layers 222, 223, and 224, but is not limited thereto.

The first conductive type semiconductor layer 222 is disposed under the light-transmitting substrate 221 and may be implemented as a semiconductor doped with a first conductive type dopant, for example, an n-type semiconductor layer. The first conductive type semiconductor layer 222 includes a composition formula of $In_xAl_yGa_{1-x-y}N$ ($0 \leq x \leq 1$, $0 \leq y \leq 1$, $0 \leq x+y \leq 1$). The first conductive semiconductor layer 222 may be selected from a compound semiconductor of a group III-V element, such as GaN, AN, AlGaN, InGaN, InN, InAlGaN, AlInN, AlGaAs, GaP, GaAs, GaAsP, and AlGaInP. The first conductive type dopant is an n-type dopant and includes a dopant such as Si, Ge, Sn, Se, and Te. The active layer 223 is disposed under the first conductive type semiconductor layer 222 and selectively includes a single quantum well, a multiple quantum well (MQW), a quantum wire structure, or a quantum dot structure. And the cycle of the well layer and the barrier layer. The cycle of the well layer/barrier layer may include, for example, at least one of a pair of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs. The second conductive type semiconductor layer 224 is disposed under the active layer 223. The second conductive type semiconductor layer 224 includes a semiconductor doped with a second conductive type dopant, for example, a composition formula of $In_xAl_yGa_{1-x-y}N$ ($0 \leq x \leq 1$, $0 \leq y \leq 1$, $0 \leq x+y \leq 1$). The second conductive type semiconductor layer 224 may be formed of at least one of compound semiconductors such as GaN, InN, AN, InGaN, AlGaN, InAlGaN, AlInN, AlGaAs, GaP, GaAs, GaAsP, and AlGaInP. The second conductive type semiconductor layer 224 is a p-type semiconductor layer, and the first conductive type dopant is a p-type dopant, and may include Mg, Zn, Ca, Sr, and Ba. As another example of the light emitting structure 225, the first conductive type semiconductor layer 222 may be implemented as a p-type semiconductor layer, and the second conductive type semiconductor layer 224 may be implemented as an n-type semiconductor layer. A third conductive type semiconductor layer having a polarity opposite to that of the second conductive type may be formed under the second conductive type semiconductor layer 224. In addition, the light emitting structure 225 may be implemented in any one of an n-p junction structure, a p-n junction structure, an n-p-n junction structure, and a p-n-p junction structure.

First and second electrodes 245 and 247 are disposed under the light emitting structure 225. The first electrode 245 is electrically connected to the first conductive type semiconductor layer 222, and the second electrode 247 is electrically connected to the second conductive type semiconductor layer 224. The first and second electrodes 245 and 247 may have a polygonal or circular bottom shape. A plurality of recesses 226 may be provided in the light emitting structure 225.

The light emitting device includes first and second electrode layers 241 and 242, third electrode layers 243, and insulating layers 231 and 233. Each of the first and second electrode layers 241 and 242 may be formed as a single layer or multiple layers, and may function as a current diffusion layer. The first and second electrode layers 241 and 242 may include a first electrode layer 241 disposed under the light emitting structure 225, and a second electrode layer 242 disposed under the first electrode layer 241. The first electrode layer 241 diffuses current, and the second electrode layer 241 reflects incident light.

The first and second electrode layers 241 and 242 may be formed of different materials. The first electrode layer 241 may be formed of a translucent material, for example, a metal oxide or a metal nitride. The first electrode layer 241 may be formed selectively of, for example, indium tin oxide (ITO), ITO nitride (ITO), indium zinc oxide (IZO), IZO nitride (IZON), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), GZO (gallium zinc oxide). The second electrode layer 242 is in contact with a lower surface of the first electrode layer 241 and may function as a reflective electrode layer. The second electrode layer 242 includes a metal such as Ag, Au, or Al. The second electrode layer 242 may partially contact the lower surface of the light emitting structure 225, when a portion of the first electrode layer 241 is removed.

As another example, the structures of the first and second electrode layers 241 and 242 may be stacked in an omni directional reflector layer (ODR) structure. The omni-directional reflective structure may be formed in a stacked structure of a first electrode layer 241 having a low refractive index and a second electrode layer 242 made of a highly reflective metal material in contact with the first electrode layer 241. The electrode layers 241 and 242 may have, for example, a stacked structure of ITO/Ag. The omnidirectional reflection angle at the interface between the first electrode layer 241 and the second electrode layer 242 may be improved.

As another example, the second electrode layer 242 may be removed, and may be formed of a reflective layer of a different material. The reflective layer may be formed in a distributed Bragg reflective (DBR) structure, and the distributed Bragg reflective structure includes a structure in which two dielectric layers having different refractive indices are alternately disposed, for example, a $SiO_2$ layer, a $Si_3N_4$ layer, a $TiO_2$ layer, an $Al_2O_3$ layer, and an MgO layer. As another example, the electrode layers 241 and 242 may include both a distributed Bragg reflective structure and an omni-directional reflective structure, and in this case, a light emitting device having a light reflectance of 98% or more may be provided. Since the light emitting device mounted in the flip method emits light reflected from the second electrode layer 242 through the light-transmitting substrate 221, most of the light may be emitted in a vertical direction. Light emitted to the side of the light emitting device may be reflected by the reflective member 31 to the light exit region through the adhesive member according to an embodiment of the invention.

The third electrode layer 243 is disposed under the second electrode layer 242 and is electrically insulated from the first and second electrode layers 241 and 242. The third electrode layer 243 is formed of a metal such as titanium (Ti), copper (Cu), nickel (Ni), gold (Au), chromium (Cr), tantalum (Ta), platinum (Pt), tin (Sn), silver (Ag), and phosphorus (P). A first electrode 245 and a second electrode 247 are disposed under the third electrode layer 243.

The insulating layers 231 and 233 block unnecessary contact between the first and second electrode layers 241 and 242, the third electrode layer 243, the first and second electrodes 245 and 247, and the layers of the light emitting structure 225. The insulating layers 231 and 233 include first and second insulating layers 231 and 233, and the first insulating layer 231 is disposed between the third electrode layer 243 and the second electrode layer 242. The second insulating layer 233 is disposed between the third electrode layer 243 and the first and second electrodes 245 and 247.

The third electrode layer 243 is connected to the first conductive type semiconductor layer 222. The connection portion 244 of the third electrode layer 243 protrudes in a via structure through the lower portions of the first and second electrode layers 241 and 242 and the light emitting structure 225 and contacts the first conductive semiconductor layer 222. The connection portion 244 may be disposed in plurality. A portion 232 of the first insulating layer 231 extends along the recess 226 of the light emitting structure 225 around the connection portion 244 of the third electrode layer 243, and may blocks an electrically connection between the third electrode layer 243 and the first and second electrode layers 241 and 242, the second conductive type semiconductor layer 224 and the active layer 223. An insulating layer may be disposed on the side of the light emitting structure 225 to protect the side thereof, but the embodiment is not limited thereto.

The second electrode 247 is disposed under the second insulating layer 233 and contacts or connected to at least one of the first and second electrode layers 241 and 242 through the open region of the second insulating layer 233. The first electrode 245 is disposed under the second insulating layer 233 and is connected to the third electrode layer 243 through an open region of the second insulating layer 233. Accordingly, the protrusion portion 248 of the second electrode 247 is electrically connected to the second conductive type semiconductor layer 224 through the first and second electrode layers 241 and 242, and the protrusion portion 246 of the first electrode 245 is electrically connected to the first conductive type semiconductor layer 222 through the third electrode layer 243.

Figure 14:
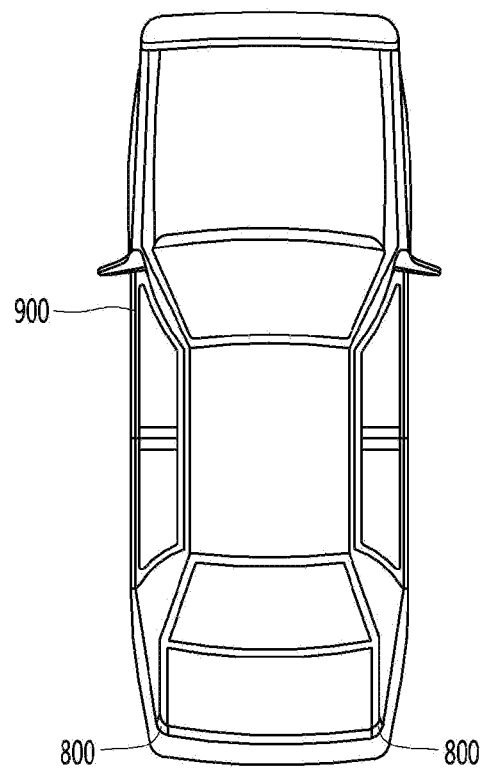
FIG. 14 is a plan view of a vehicle to which a lamp having a lighting module according to an exemplary embodiment is applied.
Figure 14:
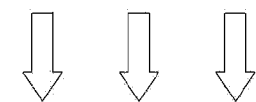
Figure 15:
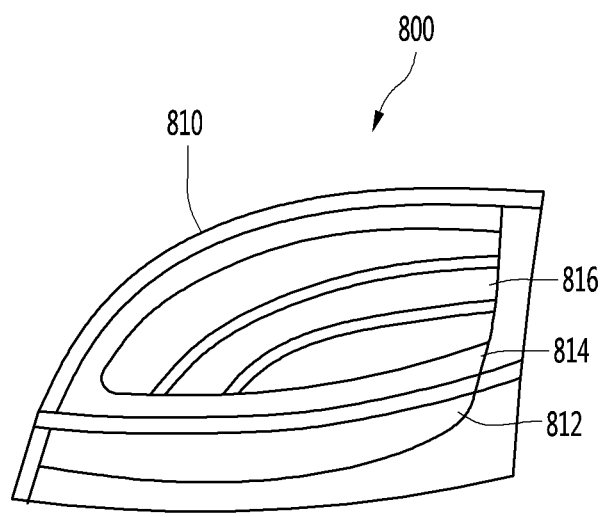
FIG. 15 is a diagram illustrating a lamp having a lighting module or a lighting device according to an embodiment of the invention.

FIG. 14 is a plan view of a vehicle to which a vehicle lamp to which a lighting module is applied according to an embodiment of the invention is applied, and FIG. 15 is a view showing a vehicle lamp having a lighting module or a lighting device disclosed in an embodiment of the invention.

Referring to FIGS. 14 and 15, the rear light 800 in the vehicle 900 may include a first lamp unit 812, a second lamp unit 814, a third lamp unit 816, and a housing 810. Here, the first lamp unit 812 may be a light source functioning as a turn indicator, the second lamp unit 814 may be a light source functioning as a tail lamp, and the third lamp unit 816 a light source functioning as a brake light, but is not limited thereto. At least one or all of the first to third lamp units 812, 814, and 816 may include the lighting module disclosed in the embodiment of the invention. The housing 810 accommodates the first to third lamp units 812, 814, and 816, and may be made of a light-transmitting material. At this time, the housing 810 may have a curvature according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, and the like described in the above embodiments are included in at least one embodiment of the invention, and are not necessarily limited to only one embodiment. Furthermore, the features, structures, effects, and the like illustrated in each embodiment may be implemented by combining or modifying other embodiments by a person having ordinary knowledge in the field to which the embodiments belong. Therefore, contents related to such combinations and modifications should be interpreted as being included in the scope of the invention.

What is claimed is:

1. A lighting module comprising:
a substrate;
a plurality of light emitting devices disposed on an upper surface of the substrate;
a resin layer disposed on the plurality of light emitting devices; and
a reflective member disposed around the plurality of light emitting devices and disposed on the upper surface of the substrate,
wherein the reflective member includes a plurality of reflective units including a first reflective region and a second reflective region facing the first reflective region,
wherein at least one of the plurality of reflective units has a first angle between a straight line connecting an uppermost point of the first reflective region and a first point where the substrate and the first reflective region are in contact with each other and a tangent line of the substrate at the first point, and has a second angle between a straight line connecting an uppermost point of the second reflective region and a second point where the substrate and the second reflective region are in contact with each other and a tangent line of the substrate at the second point,
wherein at least one of the plurality of reflective units has the first angle and the second angle different from each other,
wherein a part of the reflective member is disposed between the plurality of light emitting devices, respectively, and
wherein the plurality of light emitting devices overlap the substrate and the resin layer in a vertical direction,
wherein the resin layer has an upper surface that extends in a horizontal direction and vertically overlaps each of the plurality of light emitting devices and the reflective member,
part of the resin layer is provided, in the vertical direction, between the upper surface of the resin layer and each of the light emitting devices,
part of the resin layer is provided, in the vertical direction, between the upper surface of the resin layer and an uppermost point of the reflective member which is vertically closer to the upper surface of the resin layer than an upper surface of the light emitting device, and
wherein a height of the reflective member from a bottom surface of the reflective member to the uppermost point of the reflective member is greater than a thickness of each of the plurality of light emitting devices and is smaller than a height of the resin layer from a bottom surface of the resin layer to the upper surface of the resin layer,
wherein the lighting module further comprising:
a phosphor layer having an upper portion disposed on the upper surface of the resin layer, and the phosphor layer includes first and second side portions disposed on opposite sides of each other and a protrusion portion, each of the first and second side portions of the phosphor layer is disposed on opposite sides of the resin layer and is joined with the upper portion, the upper portion extending in the horizontal direction to vertically overlap each of the plurality of light emitting device and the reflective member, the protrusion portion extending in the vertical direction from the upper portion, each of the first and second side portions of the phosphor layer is in contact with outer surfaces of an outermost reflective units of the reflective member, and lower ends of the first and second side portions of the phosphor layer are adhered to an upper surface of the substrate, wherein the phosphor layer is made of a different material than the resin layer, and the phosphor layer is a continuous layer that includes the first and second side portions, the upper portion and the protrusion portion,
a light shielding portion disposed on the upper surface of the resin layer such that the light shielding portion is disposed between the phosphor layer and the resin layer and such that the light shielding portion is overlapping the upper surface of each of the light emitting devices in the vertical direction, and
the protrusion portion of the phosphor layer overlaps the light shielding portion in the vertical direction and further protrudes in the vertical direction from the upper surface of the phosphor layer, and the protrusion portion overlaps the light emitting devices in the vertical direction such that the light shielding portion is between the protrusion portion and the light emitting devices in the vertical direction.

2. The lighting module of claim 1, wherein at least one of the plurality of reflective units has the first angle smaller than the second angle.

3. The lighting module of claim 1, wherein the plurality of reflective units includes adjacent first and second reflective units,
wherein the first angles in the first and second reflective units are different from each other,
wherein the first angle and the second angle are a same in at least one other of the plurality of reflective units.

4. The lighting module of claim 3, wherein a region in which the second reflective region of the first reflective unit and the first reflective region of the second reflective unit contact each other includes the uppermost point,
wherein the first reflective region and the second reflective region include a concave curved surface having a curvature.

5. The lighting module of claim 1, wherein a height of the first reflective region and a height of the second reflective region in at least one of the plurality of reflective units have a same height from the upper surface of the substrate.

6. The lighting module of claim 1, wherein a first distance from a center of the upper surface of the light emitting device to the uppermost point of the first reflective region is greater than a second distance from a center of the upper surface of the light emitting device to the uppermost point of the second reflective region.

7. The lighting module of claim 6, wherein an interval between the plurality of light emitting devices is a same, and
wherein the first point and the second point are spaced apart from a center of a lower surface of each of the light emitting devices to a same distance from each other.

8. The lighting module of claim 1,
wherein the upper surface of the substrate has a curvature.

9. The lighting module of claim 1, wherein the height of the reflective member is in a range of 0.4 to 0.6 times the height of the resin layer, and
wherein a thickness of the resin layer is 4 mm or less.

10. The lighting module of claim 1, wherein:
the plurality of light emitting devices emit a same blue light,
the phosphor layer emits red light, and
the lighting module emits red surface light.

11. A lighting module comprising:
a substrate;
a plurality of light emitting devices disposed on an upper surface of the substrate;
a resin layer disposed on the plurality of light emitting devices; and
a reflective member disposed around the plurality of light emitting devices and disposed on an upper surface of the substrate,
wherein the plurality of light emitting devices include a first light emitting device and a second light emitting device,
wherein the reflective member includes a first reflective unit disposed around the first light emitting device and a second reflective unit disposed around the second light emitting device,
wherein each of the first and second reflective units includes a first reflective region disposed on one side of the first and second light emitting devices and a second reflective region disposed on other side of the first and second light emitting devices,
wherein the first reflective unit has a first inclination angle between a straight line passing through an uppermost point of the first reflective region and a center of an upper surface of the first light emitting device and a first tangent line of the substrate in contact with a normal line passing through the center of the upper surface of the first light emitting device,
wherein the second reflective unit has a second inclination angle between a straight line passing through the uppermost point of the first reflective region and a center of an upper surface of the second light emitting device and a second tangent line of the substrate in contact with a normal line passing through the center of the upper surface of the second light emitting device,
wherein the first inclination angle of the first reflective unit and the second inclination angle of the second reflective unit are different from each other,
wherein the resin layer has an upper surface that extends in a horizontal direction and vertically overlaps each of the plurality of light emitting devices and the reflective member,
part of the resin layer is provided, in the vertical direction, between the upper surface of the resin layer and each of the light emitting devices,
part of the resin layer is provided, in the vertical direction, between the upper surface of the resin layer and an uppermost point of the reflective member which is vertically closer to the upper surface of the resin layer than an upper surface of each of the light emitting devices, and
wherein a height of the reflective member from a bottom surface of the reflective member to the uppermost point of the reflective member is greater than a thickness of each of the plurality of light emitting devices and is smaller than a height of the resin layer from a bottom surface of the resin layer to the upper surface of the resin layer,
wherein the lighting module further comprising:
a phosphor layer having an upper portion disposed on the upper surface of the resin layer, and the phosphor layer includes first and second side portions disposed on opposite sides of each other, the first and second side portions of the phosphor layer are disposed on first and second side surfaces of the resin layer, each of the first and second side portions of the phosphor layer is in contact with the first and second sides surfaces and in contact with outer surfaces of an outermost reflective units of the reflective member, and lower ends of the first and second side portions of the phosphor layer is adhered to an upper surface of the substrate, wherein the phosphor layer is made of a different material than the resin layer,
a light shielding portion disposed on the upper surface of the resin layer such that the light shielding portion is disposed between the phosphor layer and the resin layer and such that the light shielding portion is overlapping the upper surface of each of the light emitting devices in the vertical direction, and a protrusion portion overlaps the light emitting devices in the vertical direction such that the light shielding portion is between the protrusion portion and the light emitting devices in the vertical direction, wherein an outer side of the reflective member is a side adjacent to an outer side of the substrate and is disposed on a same plane as an outer side of the resin layer, and wherein an outer portion of the resin layer is be spaced apart from the upper surface of the substrate.

12. The lighting module of claim 11, wherein the first reflective unit has a third inclination angle between a straight line passing through an uppermost point of the second reflective region and the center of the upper surface of the first light emitting device and the first tangent line, wherein the second reflective unit has a fourth inclination angle between a straight line passing through the uppermost point of the first reflective region and the center of the upper surface of the second light emitting device and the second tangent line, wherein the third inclination angle of the first reflective unit and the fourth inclination angle of the second reflective unit are different from each other.

13. The lighting module of claim 12, wherein the first inclination angle of the first reflective unit is greater than the first inclination angle of the second reflective unit, and wherein the third inclination angle of the first reflective unit is smaller than the fourth inclination angle of the second reflective unit.

14. The lighting module of claim 13, wherein a region in which the second reflective region of the first reflective unit and the first reflective region of the second reflective unit contact each other includes the uppermost point, wherein the first reflective region and the second reflective region include a concave curved surface having a curvature.

15. The lighting module of claim 13, wherein a height of the first reflective region and a height of the second reflective region in at least one of the first and second reflective units have a same height from the upper surface of the substrate.

16. The lighting module of claim 12, wherein a first distance from the center of the upper surface of the first light emitting device to the uppermost point of the first reflective region is greater than a second distance from the center of the upper surface of the first light emitting device to the uppermost point of the second reflective region.

17. The lighting module of claim 16, wherein an interval between the plurality of light emitting devices is a same, wherein the first point and the second point are spaced apart from each other by a same distance from a center of a lower surface of each of the light emitting devices.

18. The lighting module of claim 11, wherein a part of the resin layer is disposed between the first and second reflective units and is in contact with the light emitting devices.

19. The lighting module of claim 12, wherein the plurality of light emitting devices overlap the substrate and the resin layer in the vertical direction, wherein a lower portion of the resin layer is disposed between the first and second reflective units and is in contact with the light emitting devices, wherein the upper surface of the substrate has a curvature.

20. The lighting module of claim 12, wherein a lower portion of the resin layer is disposed between the first and second reflective units and is in contact with the light emitting devices, wherein a thickness of the lighting module is less than 5.5 mm wherein a thickness of the resin layer is 4 mm or less, and wherein the height of the reflective member has a range of 0.4 to 0.6 times the thickness of the resin layer.

* * * * *